United States Patent
Namiki et al.

(10) Patent No.: US 8,547,744 B2
(45) Date of Patent: Oct. 1, 2013

(54) NONVOLATILE SEMICONDUCTOR MEMORY DEVICE

(75) Inventors: Yuko Namiki, Yokohama (JP); Mitsuaki Honma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 13/185,755

(22) Filed: Jul. 19, 2011

(65) Prior Publication Data

US 2012/0020154 A1 Jan. 26, 2012

(30) Foreign Application Priority Data

Jul. 20, 2010 (JP) ................... 2010-163344

(51) Int. Cl.
*G11C 16/04* (2006.01)
(52) U.S. Cl.
USPC ................... 365/185.17; 365/185.18
(58) Field of Classification Search
USPC ............ 365/185.17, 185.18, 185.28
See application file for complete search history.

(56) References Cited

U.S. PATENT DOCUMENTS

| 7,257,032 | B2 | 8/2007 | Fujiu et al. | |
| 7,508,704 | B2 | 3/2009 | Honma et al. | |
| 7,911,847 | B2 * | 3/2011 | Kang et al. | 365/185.18 |
| 2004/0080980 | A1 * | 4/2004 | Lee | 365/185.17 |
| 2008/0159003 | A1 * | 7/2008 | Dong et al. | 365/185.25 |
| 2009/0296469 | A1 | 12/2009 | Guterman | |

FOREIGN PATENT DOCUMENTS

JP 2006-228394 8/2006

* cited by examiner

*Primary Examiner* — Vu Le
(74) *Attorney, Agent, or Firm* — Oblon, Spivak, McClelland, Maier & Neustadt, L.L.P.

(57) ABSTRACT

According to one embodiment, a nonvolatile semiconductor memory device includes memory cells storing data in a nonvolatile manner, word lines connected to the memory cells and including a first word line and a second word line which is n-th (n is an integer of 1 or more) from the first word line, and a control circuit configured to control a voltage of a word line to write data to a memory cell so that data are written in order from the first word line to the second word line. In a write sequence of the first word line, the control circuit applies a writing voltage to the second word line before writing a memory cell connected to the first word line.

20 Claims, 27 Drawing Sheets

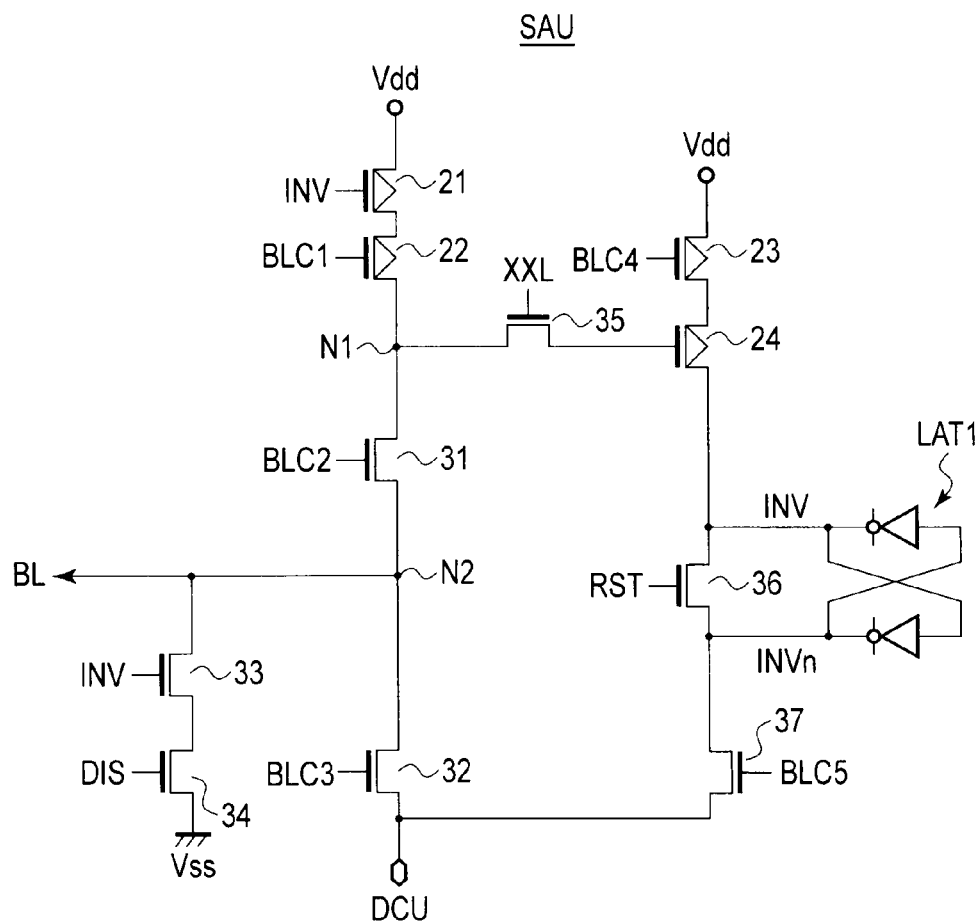
F I G. 3

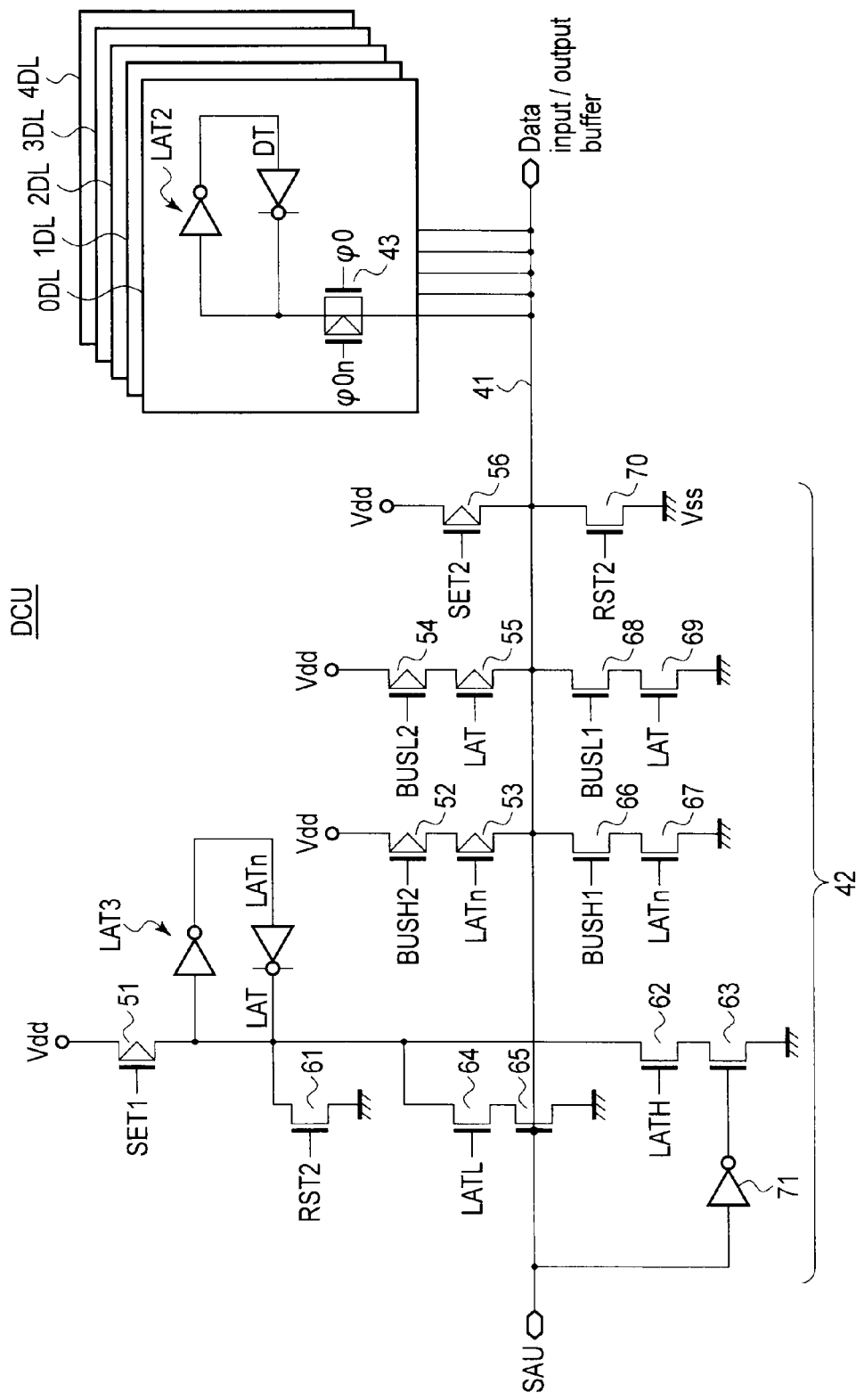
F I G. 4

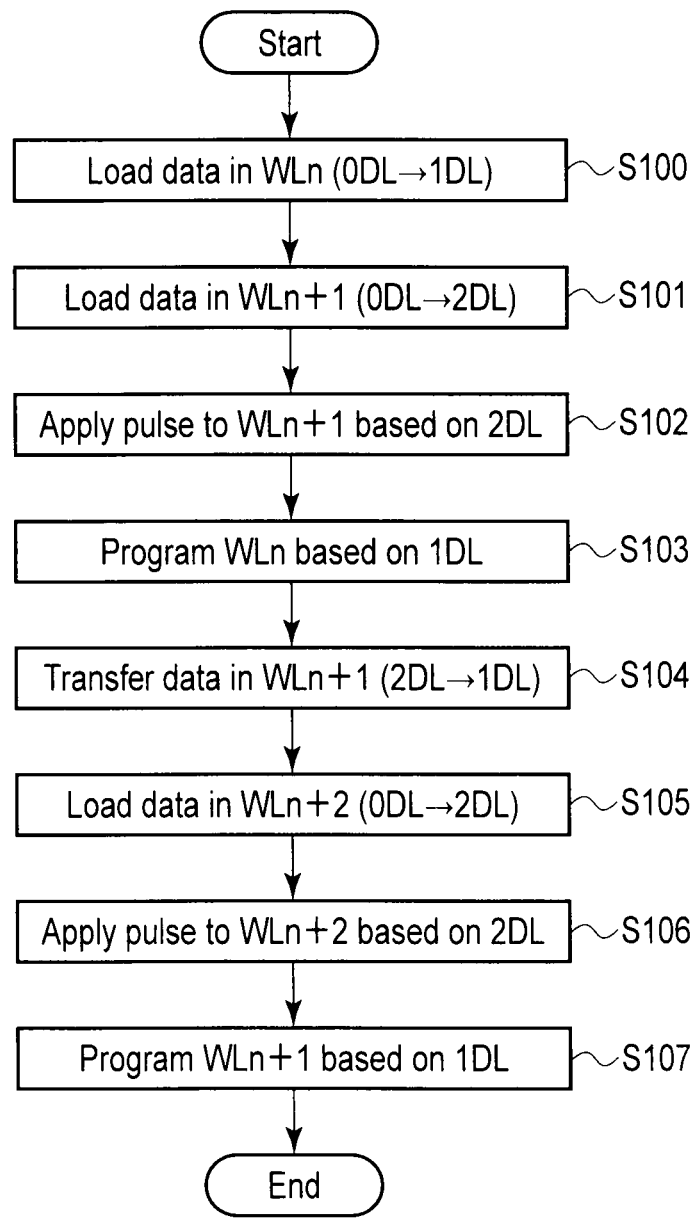
F I G. 7

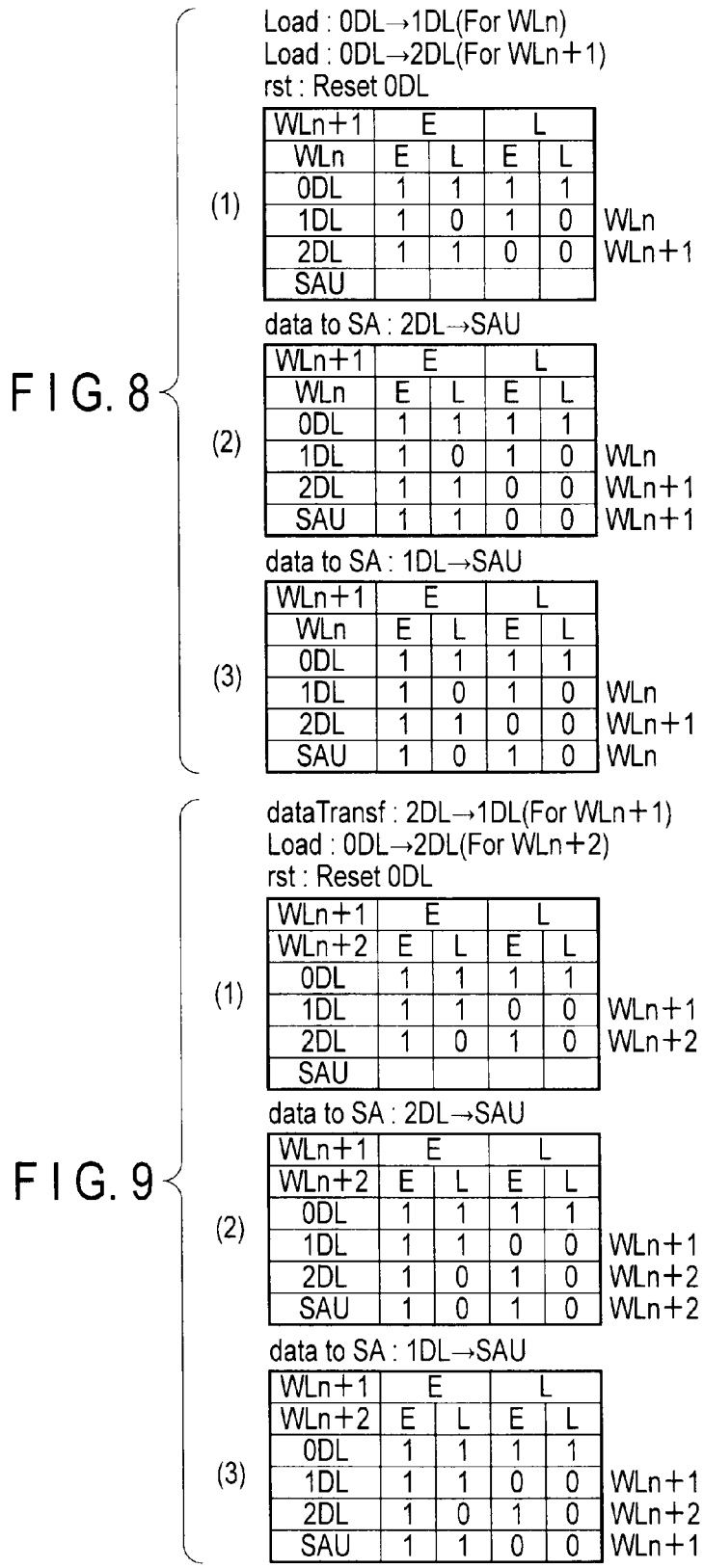

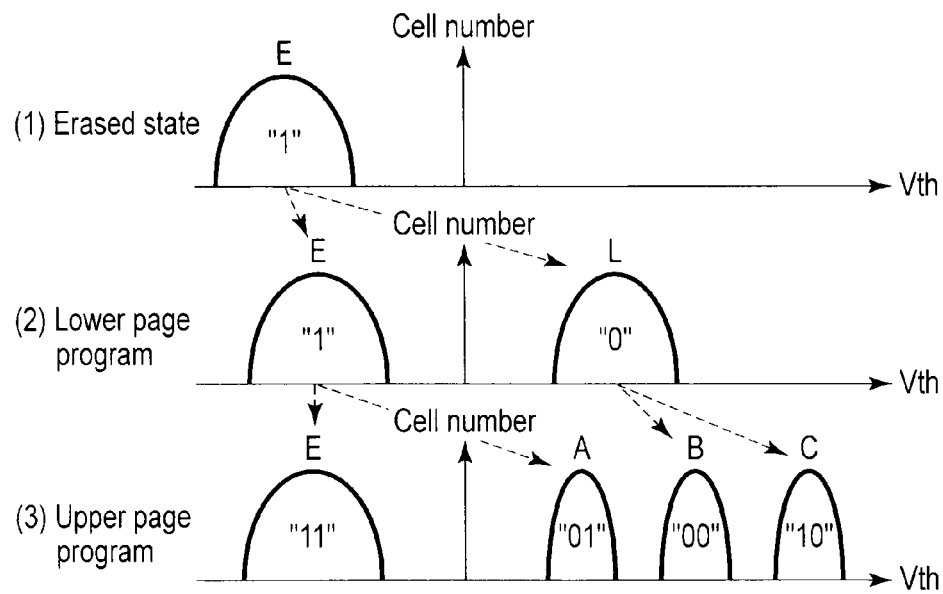
F I G. 1 2
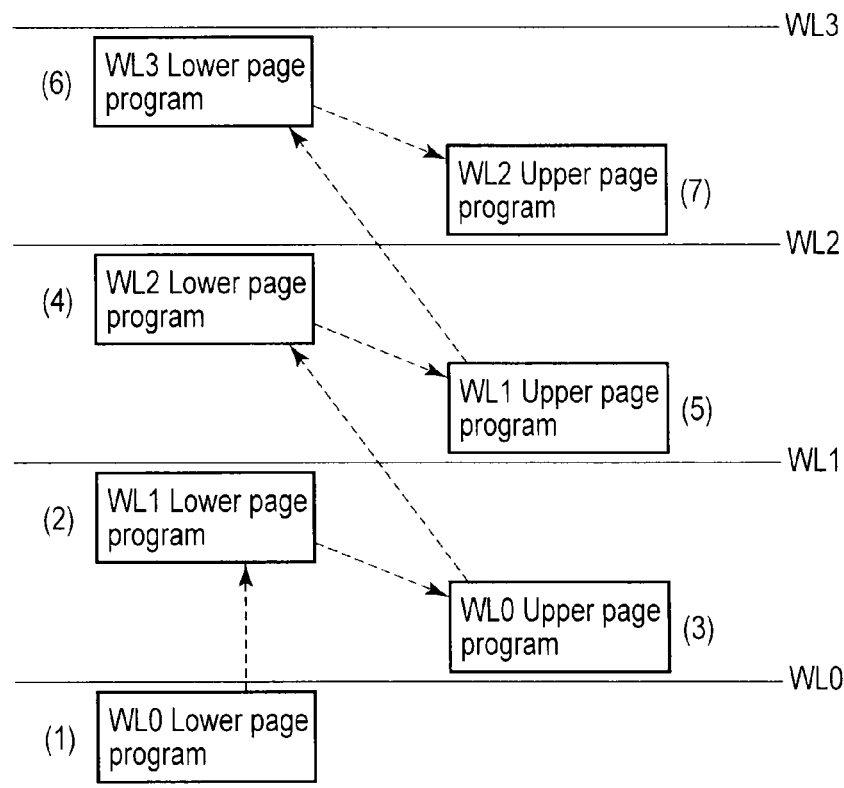
F I G. 1 3

(1)
Load : WLn+1 Lower 0DL→1DL
rst : Reset 0DL

| WLn+1 | E | | | | A | | | | B | | | | C | | | | |
|---|---|---|---|---|---|---|---|---|---|---|---|---|---|---|---|---|---|
| WLn | E | A | B | C | E | A | B | C | E | A | B | C | E | A | B | C | |
| 0DL | 1 | 1 | 1 | 1 | 1 | 1 | 1 | 1 | 1 | 1 | 1 | 1 | 1 | 1 | 1 | 1 | |
| 1DL | 1 | 1 | 1 | 1 | 1 | 1 | 1 | 1 | 0 | 0 | 0 | 0 | 0 | 0 | 0 | 0 | WLn+1 L |
| 2DL | 1 | 1 | 1 | 1 | 1 | 1 | 1 | 1 | 0 | 0 | 0 | 0 | 0 | 0 | 0 | 0 | WLn L |
| 3DL | | | | | | | | | | | | | | | | | |
| 4DL | 1 | 1 | 1 | 1 | 0 | 0 | 0 | 0 | 0 | 0 | 0 | 0 | 1 | 1 | 1 | 1 | WLn U |
| SAU | | | | | | | | | | | | | | | | | |

(2)
data to SA : 1DL→SAU

| WLn+1 | E | | | | A | | | | B | | | | C | | | | |
|---|---|---|---|---|---|---|---|---|---|---|---|---|---|---|---|---|---|
| WLn | E | A | B | C | E | A | B | C | E | A | B | C | E | A | B | C | |
| 0DL | 1 | 1 | 1 | 1 | 1 | 1 | 1 | 1 | 1 | 1 | 1 | 1 | 1 | 1 | 1 | 1 | |
| 1DL | 1 | 1 | 1 | 1 | 1 | 1 | 1 | 1 | 0 | 0 | 0 | 0 | 0 | 0 | 0 | 0 | WLn+1 L |
| 2DL | 1 | 1 | 1 | 1 | 1 | 1 | 1 | 1 | 0 | 0 | 0 | 0 | 0 | 0 | 0 | 0 | WLn L |
| 3DL | | | | | | | | | | | | | | | | | |
| 4DL | 1 | 1 | 1 | 1 | 0 | 0 | 0 | 0 | 0 | 0 | 0 | 0 | 1 | 1 | 1 | 1 | WLn U |
| SAU | 1 | 1 | 1 | 1 | 1 | 1 | 1 | 1 | 0 | 0 | 0 | 0 | 0 | 0 | 0 | 0 | WLn+1 L |

(3)
Load : WLn+1 Upper 0DL→4DL
Load : WLn++1 Lower 0DL→2DL/data reading (SAU→2DL)
Load : WLn Upper 0DL→3DL/data transfer (4DL→3DL)
Load : WLn Lower 0DL→1DL/data transfer (2DL→1DL)
 / data reading (SAU→1DL)
data : 2DL XNOR 4DL→SAU
rst : Reset 0DL

| WLn+1 | E | | | | A | | | | B | | | | C | | | | |
|---|---|---|---|---|---|---|---|---|---|---|---|---|---|---|---|---|---|
| WLn | E | A | B | C | E | A | B | C | E | A | B | C | E | A | B | C | |
| 0DL | 1 | 1 | 1 | 1 | 1 | 1 | 1 | 1 | 1 | 1 | 1 | 1 | 1 | 1 | 1 | 1 | |
| 1DL | 1 | 1 | 0 | 0 | 1 | 1 | 0 | 0 | 1 | 1 | 0 | 0 | 1 | 1 | 0 | 0 | WLn L |
| 2DL | 1 | 1 | 1 | 1 | 1 | 1 | 1 | 1 | 0 | 0 | 0 | 0 | 0 | 0 | 0 | 0 | WLn+1 L |
| 3DL | 1 | 0 | 0 | 1 | 1 | 0 | 0 | 1 | 1 | 0 | 0 | 1 | 1 | 0 | 0 | 1 | WLn U |
| 4DL | 1 | 1 | 1 | 1 | 0 | 0 | 0 | 0 | 0 | 0 | 0 | 0 | 1 | 1 | 1 | 1 | WLn+1 U |
| SAU | 1 | 1 | 1 | 1 | 0 | 0 | 0 | 0 | 1 | 1 | 1 | 1 | 0 | 0 | 0 | 0 | WLn+1 A/C |

(4)
data to SA : 3DL&1DL→SAU

| WLn+1 | E | | | | A | | | | B | | | | C | | | | |
|---|---|---|---|---|---|---|---|---|---|---|---|---|---|---|---|---|---|
| WLn | E | A | B | C | E | A | B | C | E | A | B | C | E | A | B | C | |
| 0DL | 1 | 1 | 1 | 1 | 1 | 1 | 1 | 1 | 1 | 1 | 1 | 1 | 1 | 1 | 1 | 1 | |
| 1DL | 1 | 1 | 0 | 0 | 1 | 1 | 0 | 0 | 1 | 1 | 0 | 0 | 1 | 1 | 0 | 0 | WLn L |
| 2DL | 1 | 1 | 1 | 1 | 1 | 1 | 1 | 1 | 0 | 0 | 0 | 0 | 0 | 0 | 0 | 0 | WLn+1 L |
| 3DL | 1 | 0 | 0 | 1 | 1 | 0 | 0 | 1 | 1 | 0 | 0 | 1 | 1 | 0 | 0 | 1 | WLn U |
| 4DL | 1 | 1 | 1 | 1 | 0 | 0 | 0 | 0 | 0 | 0 | 0 | 0 | 1 | 1 | 1 | 1 | WLn+1 U |
| SAU | 1 | 0 | 0 | 0 | 1 | 0 | 0 | 0 | 1 | 0 | 0 | 0 | 1 | 0 | 0 | 0 | WLn Uprog |

FIG. 16

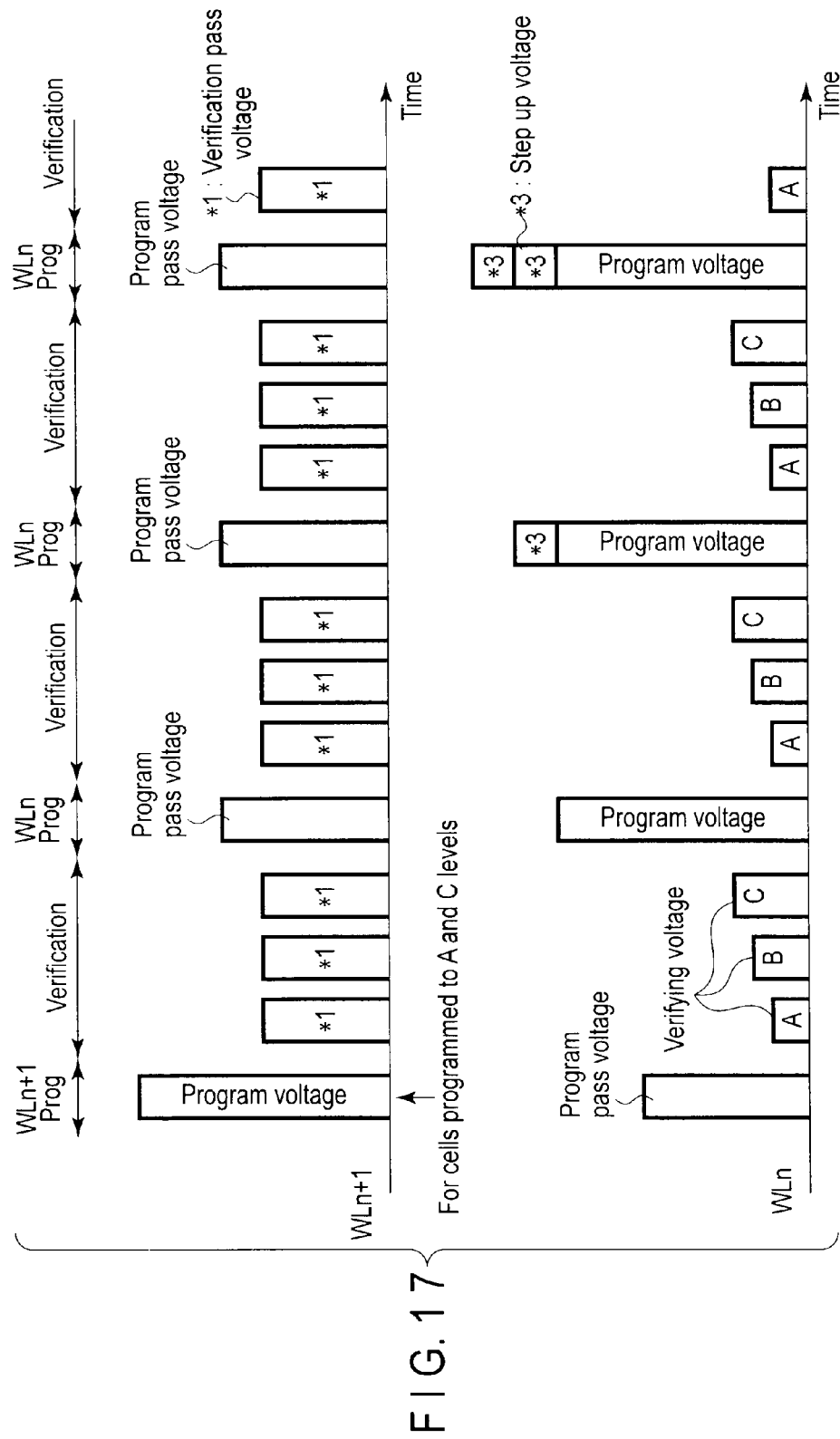
F I G. 17

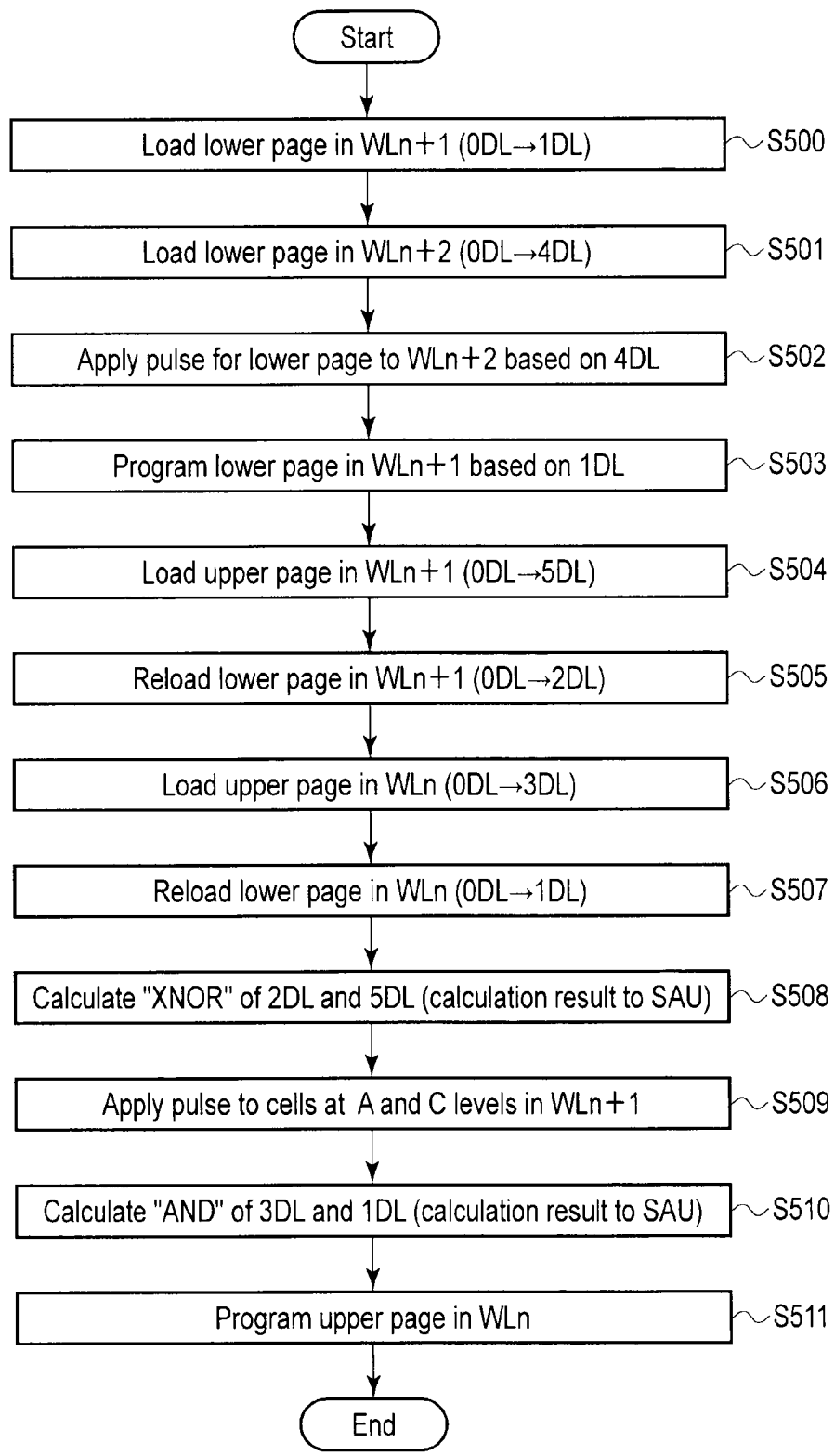
F I G. 24

(1)
Load : WLn Lower 0DL→1DL/data transfer(3DL→1DL)
Load : WLn+1 Lower 0DL→3DL
rst : Reset 0DL

| WLn+1 | E | | | | A | | | | B | | | | C | | | | |
|---|---|---|---|---|---|---|---|---|---|---|---|---|---|---|---|---|---|
| WLn | E | A | B | C | E | A | B | C | E | A | B | C | E | A | B | C | |
| 0DL | 1 | 1 | 1 | 1 | 1 | 1 | 1 | 1 | 1 | 1 | 1 | 1 | 1 | 1 | 1 | 1 | |
| 1DL | 1 | 1 | 0 | 0 | 1 | 1 | 0 | 0 | 1 | 1 | 0 | 0 | 1 | 1 | 0 | 0 | WLn L |
| 2DL | | | | | | | | | | | | | | | | | |
| 3DL | 1 | 1 | 1 | 1 | 1 | 1 | 1 | 1 | 0 | 0 | 0 | 0 | 0 | 0 | 0 | 0 | WLn+1 L |
| SAU | | | | | | | | | | | | | | | | | |

(2)
data to SA : 3DL→SAU

| WLn+1 | E | | | | A | | | | B | | | | C | | | | |
|---|---|---|---|---|---|---|---|---|---|---|---|---|---|---|---|---|---|
| WLn | E | A | B | C | E | A | B | C | E | A | B | C | E | A | B | C | |
| 0DL | 1 | 1 | 1 | 1 | 1 | 1 | 1 | 1 | 1 | 1 | 1 | 1 | 1 | 1 | 1 | 1 | |
| 1DL | 1 | 1 | 0 | 0 | 1 | 1 | 0 | 0 | 1 | 1 | 0 | 0 | 1 | 1 | 0 | 0 | WLn L |
| 2DL | | | | | | | | | | | | | | | | | |
| 3DL | 1 | 1 | 1 | 1 | 1 | 1 | 1 | 1 | 0 | 0 | 0 | 0 | 0 | 0 | 0 | 0 | WLn+1 L |
| SAU | 1 | 1 | 1 | 1 | 1 | 1 | 1 | 1 | 0 | 0 | 0 | 0 | 0 | 0 | 0 | 0 | WLn+1 L |

(3)
data to SA:1DL→SAU

| WLn+1 | E | | | | A | | | | B | | | | C | | | | |
|---|---|---|---|---|---|---|---|---|---|---|---|---|---|---|---|---|---|
| WLn | E | A | B | C | E | A | B | C | E | A | B | C | E | A | B | C | |
| 0DL | 1 | 1 | 1 | 1 | 1 | 1 | 1 | 1 | 1 | 1 | 1 | 1 | 1 | 1 | 1 | 1 | |
| 1DL | 1 | 1 | 0 | 0 | 1 | 1 | 0 | 0 | 1 | 1 | 0 | 0 | 1 | 1 | 0 | 0 | WLn L |
| 2DL | | | | | | | | | | | | | | | | | |
| 3DL | 1 | 1 | 1 | 1 | 1 | 1 | 1 | 1 | 0 | 0 | 0 | 0 | 0 | 0 | 0 | 0 | WLn+1 L |
| SAU | 1 | 1 | 0 | 0 | 1 | 1 | 0 | 0 | 1 | 1 | 0 | 0 | 1 | 1 | 0 | 0 | WLn L |

FIG. 29

NONVOLATILE SEMICONDUCTOR MEMORY DEVICE

CROSS-REFERENCE TO RELATED APPLICATIONS

This application is based upon and claims the benefit of priority from prior Japanese Patent Application No. 2010-163344, filed Jul. 20, 2010, the entire contents of which are incorporated herein by reference.

FIELD

Embodiments described herein relate generally to a nonvolatile semiconductor memory device.

BACKGROUND

A NAND flash memory is known as one of nonvolatile semiconductor memory devices (EEPROM) that can be rewritten electrically. A technique for increasing the data storage capacity of the NAND flash memory includes a multi-level storage method in which a threshold value distribution of a memory cell is subdivided so that the memory cell can store a plurality of bit data (multi-level data).

When charge is injected into a charge storage layer of a memory cell in a NAND flash memory, the potential of a charge storage layer of an adjacent memory cell that was written before this memory cell may be changed (inter-cell interference effect). As a result, a threshold value of the adjacent memory cell originally written may be shifted. This problem becomes more serious in a multi-level memory having a narrow threshold distribution for each piece of data to be written.

BRIEF DESCRIPTION OF THE DRAWINGS

FIG. 3 is a circuit diagram illustrating an example of a configuration of a sense amplifier unit SAU;

FIG. 4 is a circuit diagram illustrating an example of a configuration of a data control unit DCU;

FIG. 7 is a flowchart illustrating a program sequence according to the first embodiment;

FIG. 8 is a view illustrating the correspondence between word line levels and latch data;

FIG. 9 is a view illustrating the correspondence between word line levels and latch data;

FIG. 12 is a view illustrating a threshold value distribution of a memory cell MC in a four-level storage method;

FIG. 13 is a view illustrating a program order;

FIG. 16 is a view illustrating the correspondence between word line levels and latch data;

FIG. 17 is a view illustrating a voltage relationship during programming according to the modification;

FIG. 20 is a view illustrating the correspondence between word line levels and latch data;

FIG. 22 is a view illustrating the correspondence between word line levels and latch data;

FIG. 23 is a view illustrating the correspondence between word line levels and latch data;

FIG. 24 is a flowchart illustrating a program sequence according to the second modification;

FIG. 25 is a view illustrating the correspondence between word line levels and latch data;

FIG. 26 is a view illustrating the correspondence between word line levels and latch data;

FIG. 27 is a view illustrating the correspondence between word line levels and latch data;

FIG. 29 is a view illustrating the correspondence between word line levels and latch data.

DETAILED DESCRIPTION

Figure 1:
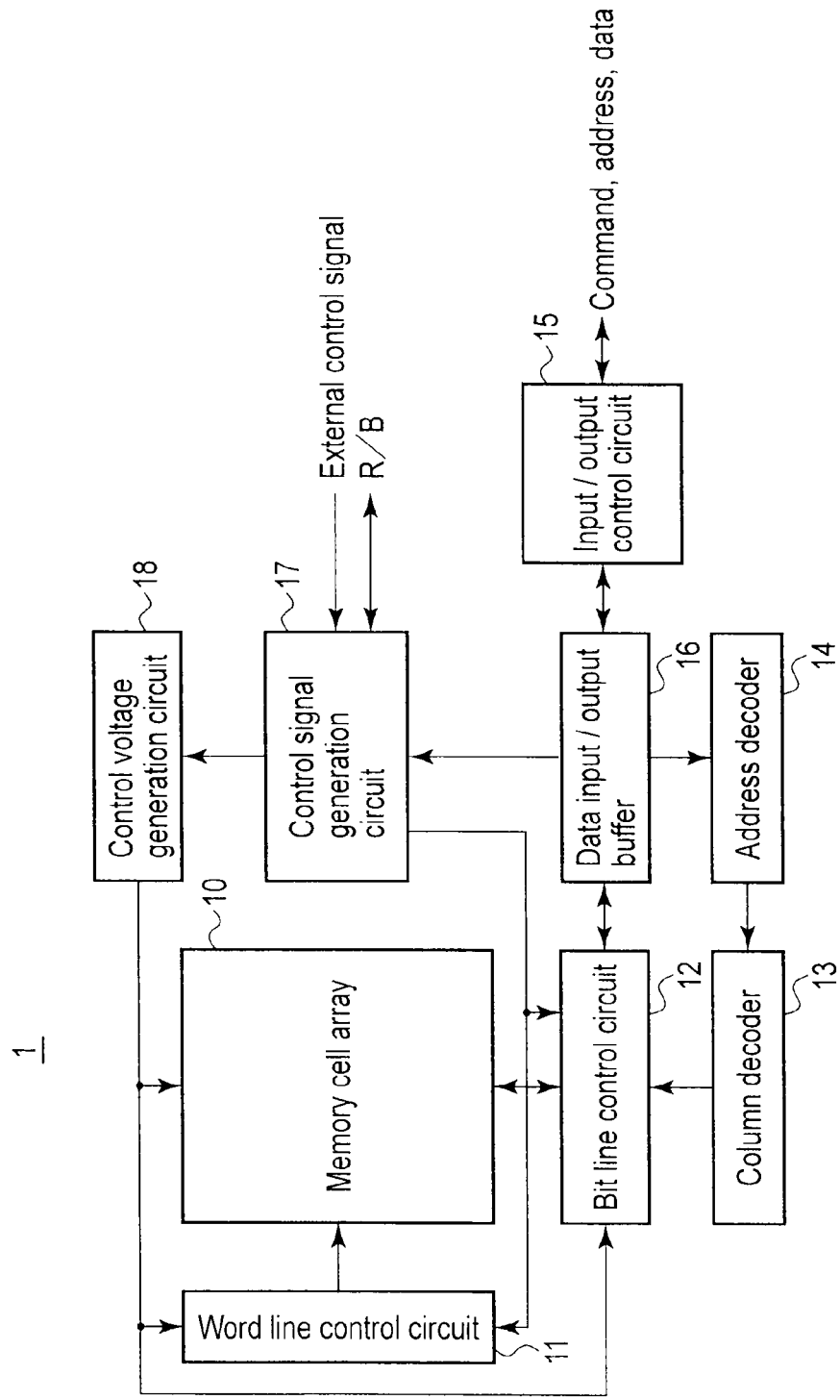
FIG. 1 is a block diagram illustrating a configuration of a NAND flash memory 1.

In general, according to one embodiment, there is provided a nonvolatile semiconductor memory device comprising:

memory cells storing data in a nonvolatile manner;

word lines connected to the memory cells and including a first word line and a second word line which is n-th (n is an integer of 1 or more) from the first word line; and a control circuit configured to control a voltage of a word line to write data to a memory cell so that data are written in order from the first word line to the second word line, wherein in a write sequence of the first word line, the control circuit applies a writing voltage to the second word line before writing a memory cell connected to the first word line.

The embodiments will be described hereinafter with reference to the accompanying drawings. In the description which follows, the same or functionally equivalent elements are denoted by the same reference numerals, to thereby simplify the description.

[1] First Embodiment

[1-1] Circuit Configuration

Figure 2:
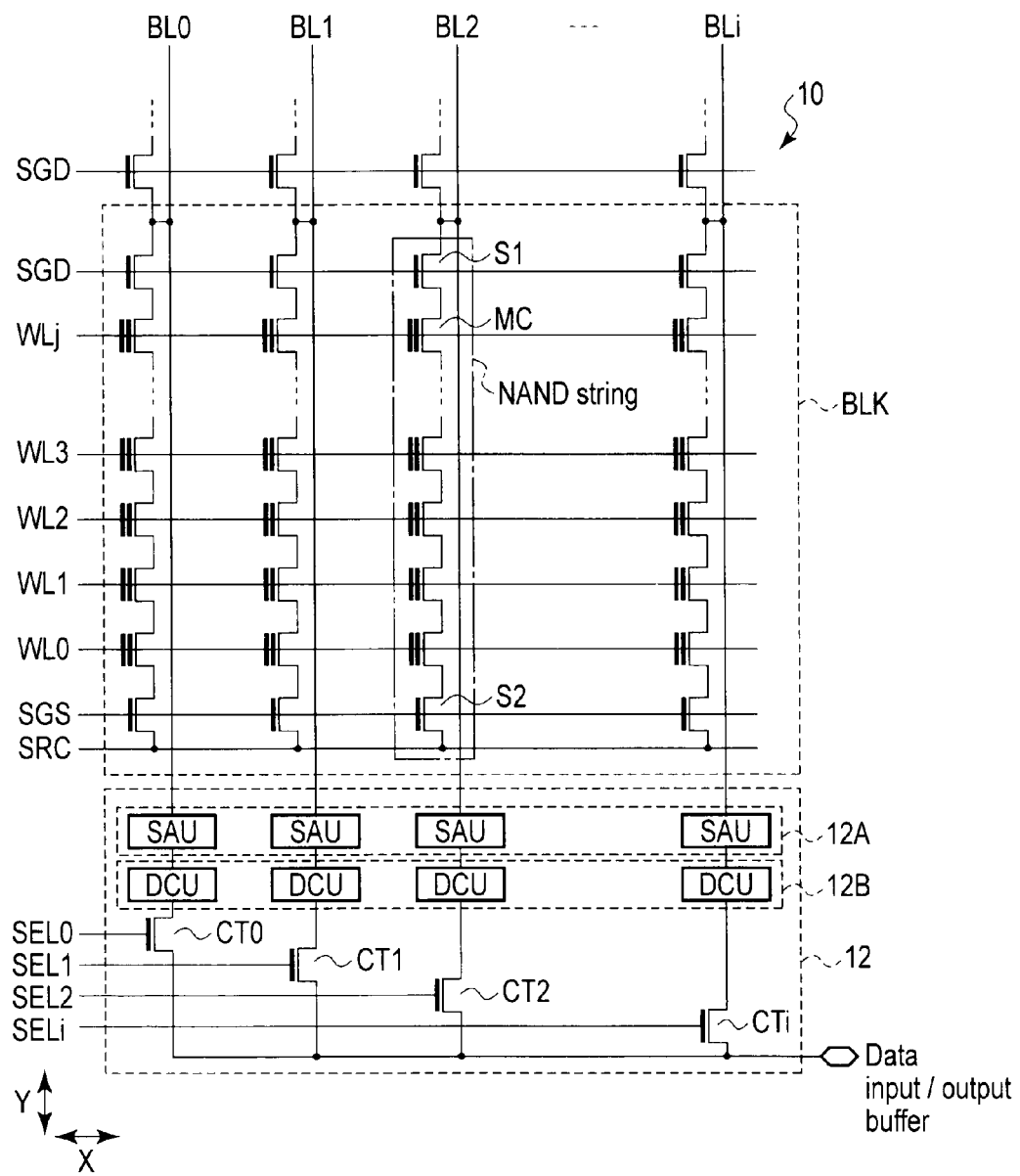
FIG. 2 is a circuit diagram illustrating examples of configurations of a memory cell array 10 and a bit line control circuit 12.

In the present embodiment, a NAND flash memory is explained as an example of a nonvolatile semiconductor memory device. FIG. 1 is a block diagram illustrating a configuration of a NAND flash memory 1 according to the first embodiment. A memory cell array 10 includes electrically-rewritable flash memory cells arranged in a matrix form. As shown in FIG. 2, the memory cell array 10 includes a plurality of word lines WL extending in an X direction, a plurality of bit lines BL extending in a Y direction crossing the X direction, and a source line SRC extending in the X direction. The specific configuration of the memory cell array 10 will be further detailed below.

The word lines WL are connected to a word line control circuit 11. The word line control circuit 11 selects a word line WL, and applies to the word line WL various voltages needed for erasing, writing, and reading data. The word line control circuit 11 includes a row decoder, a word line driver, and the like.

The bit lines BL are connected to a bit line control circuit 12. The bit line control circuit 12 selects a bit line BL, and controls the voltage of the bit line BL, thus erasing data from the memory cell, writing data to the memory cell, and reading data from the memory cell. The specific configuration of the bit line control circuit 12 will be further detailed below.

The column decoder 13 generates a column select signal SEL for selecting a bit line BL in accordance with an output signal provided by the address decoder 14. This column select signal SEL is sent to the bit line control circuit 12.

An input/output control circuit 15 controls input/output of various kinds of data to/from the outside. More specifically, the input/output control circuit 15 receives various commands, address signals, and input data from the outside, and outputs output data to the outside. When data are written, input data (write data) are sent from the input/output control circuit 15 via a data input/output buffer 16 to the bit line control circuit 12. When data are read, output data (read data) read by the bit line control circuit 12 are sent to the input/output control circuit 15 via the data input/output buffer 16, and the input/output control circuit 15 outputs the output data to the outside.

An address signal temporarily stored from the input/output control circuit 15 to the data input/output buffer 16 is sent to the address decoder 14. The signal decoded by the address decoder 14 is sent to the word line control circuit 11 and the column decoder 13.

A command temporarily stored from the input/output control circuit 15 to the data input/output buffer 16 is sent to a control signal generation circuit 17. The control signal generation circuit 17 receives, from the outside, external control signals such as a chip enable signal/CE, a write enable signal/WE, a read enable signal/RE, an address latch enable signal ALE, and a command latch enable signal CLE. The control signal generation circuit 17 provides a ready/busy signal R/B to the outside.

The control signal generation circuit 17 generates a control signal for controlling data writing and erasing sequences and a control signal for controlling data reading operation, on the basis of a command and an external control signal provided from the outside in accordance with an operation mode. This control signal is sent to the word line control circuit 11, the bit line control circuit 12, and a control voltage generation circuit 18.

The control voltage generation circuit 18 generates voltages needed for various operations of the memory cell array 10, the word line control circuit 11, and the bit line control circuit 12, such as a reading voltage, a writing voltage, a verifying voltage, and an erasing voltage, in accordance with various control signals sent from the control signal generation circuit 17.

[1-1A] Configurations of Memory Cell Array 10 and Bit Line Control Circuit 12

FIG. 2 is a circuit diagram illustrating an example of configurations of the memory cell array 10 and the bit line control circuit 12. The memory cell array 10 includes one or a plurality of blocks BLK. The block BLK is the minimum unit of data erasing operation.

Each block BLK includes (i+1) sets of NAND strings arranged in the X direction in order (i is an integer of 0 or more). The drain of the select gate transistor S1 included in the NAND string is connected to a bit line BL, and the gate thereof is commonly connected to the select gate line SGD. The source of the select gate transistor S2 included in the NAND string is commonly connected the source line SRC, and the gate thereof is commonly connected to the select gate line SGS.

Each memory cell MC is made of a MOSFET (Metal Oxide Semiconductor Field Effect Transistor) having a laminated gate structure formed on a P-type well. The laminated gate structure includes a charge storage layer formed on a P-type well with a gate insulating film interposed therebetween and a control gate electrode formed on the charge storage layer with an inter-gate insulating film interposed therebetween. In the memory cell MC, the threshold voltage changes according to the number of electrons stored in the charge storage layer, and the memory cell MC stores data according to the difference of the threshold voltage. In the first embodiment, the memory cell MC is configured to store 1-bit data (binary data).

In each NAND string, (j+1) sets of memory cells MC (j is an integer of 0 or more) are provided between the source of the select gate transistor S1 and the drain of the select gate transistor S2 in such a manner that each current path is connected in series. In other words, (j+1) sets of memory cells MC are connected in series in the Y direction in such a manner that the memory cells MC adjacent to each other share a diffusion region (a source region or a drain region).

In each NAND string, the control gate electrodes of the memory cells MC are respectively connected to the word lines WL0 to WLj in such a manner that the control gate electrode of the memory cell MC located closest to the source is connected to the word line WL0. Accordingly, the drain of the memory cell MC connected to the word line WLj is connected to the source of the select gate transistor S1, and the source of the memory cell MC connected to the word line WL0 is connected to the drain of the select gate transistor S2.

Each of the word lines WL0 to WLj is commonly connected to the control gate electrodes of the memory cells MC of the respective NAND strings within the block BLK. In other words, the control gate electrodes of the memory cells MC in the same row within the block BLK are connected to the same word line WL. A unit of "page" is constituted by the memory cells MC connected to the same word line WL. The page is the minimum unit of writing and reading.

Each of the bit lines BL0 to BLi is commonly connected to the drains of the select gate transistors S1 of the respective blocks BLK. In other words, NAND strings in the same column in the plurality of blocks BLK are connected to the same bit line BL.

The bit line control circuit 12 includes a sense amplifier circuit 12A, a data control circuit 12B, and as many column select gates CT0 to CTi as the number of bit lines BL. The sense amplifier circuit 12A has as many sense amplifier units SAU as the number of bit lines BL. Each sense amplifier unit SAU is connected to one bit line BL. The data control circuit 12B has as many data control units DCU as the number of bit lines BL. Each data control unit DCU is connected to one sense amplifier unit SAU.

When data are read, the sense amplifier unit SAU detects and holds data read from a memory cell MC to a bit line BL. The data control unit DCU is connected to the data input/output buffer 16 via a column select gate CT. The column select gates CT operate on the basis of the column select signals SEL0 to SELi sent from the column decoder 13.

In a write operation (also referred to as a program operation), read operation, and program verification operation (also referred to as verification operation), a bit line BL connected to a sense amplifier unit SAU is selected, and one word line WL is selected. The writing voltage (also referred to as program voltage), the verifying voltage, or the reading voltage are applied to the memory cell MC equivalent to one page connected to the selected word line WL, whereby the program operation, the read operation, or the verification operation are carried out with respect to one page at a time.

[1-1B] Configuration of Sense Amplifier Unit SAU

FIG. 3 is a circuit diagram illustrating an example of configuration of the sense amplifier unit SAU. The sense amplifier unit SAU includes four P-channel MOS transistors (hereinafter referred to as PMOSes) 21 to 24, seven N-channel MOS transistors (hereinafter referred to as NMOSes) 31 to 37, and a latch circuit LAT1 including, e.g., a clocked inverter circuit.

The source of the PMOS 21 is connected to a node to which a power supply voltage Vdd is provided. The drain of the PMOS 21 is connected to the data control unit DCU via a PMOS 22, an NMOS 31 and an NMOS 32. The gate of the PMOS 21 is connected to a node INV of the latch circuit LAT1 explained later. A signal BLC1 is provided to the gate of the PMOS 22 and signals BLC2 and BLC3 are respectively provided to the gates of the NMOSes 31 and 32. A connection nod N2 between the NMOS 31 and the NMOS 32 is connected to a bit line BL, and is grounded via an NMOS 33 and an NMOS 34 (in other words, the connection nod N2 is connected to a node to which a ground voltage Vss is provided). The gate of the NMOS 33 is connected to the node INV of the latch circuit LAT1, and the NMOS 33 is controlled according to data held in the latch circuit LAT1. A signal DIS is provided to the gate of the NMOS 34.

The source of a PMOS 23 is connected to a node to which the power supply voltage Vdd is provided. The drain of the PMOS 23 is connected to the data control unit DCU via a PMOS 24, an NMOS 36 and an NMOS 37. A signal BLC4 is provided to the gate of the PMOS 23. The gate of the PMOS 24 is connected to a connection nod N1 between the PMOS 22 and the NMOS 31 via an NMOS 35. A signal XXL is provided to the gate of the NMOS 35. A reset signal RST is provided to the gate of the NMOS 36. A signal BLC5 is provided to the gate of the NMOS 37. The latch circuit LAT1 is connected in parallel with the NMOS 36.

Subsequently, operation of the sense amplifier unit SAU will be explained.

(Program Operation)

When data are programmed to the memory cell MC, first, the reset signal RST is once set at a high level (hereinafter referred to as H level), and the latch circuit LAT1 is reset. In other words, the node INV of the latch circuit LAT1 is set at a low level (hereinafter referred to as L level). Thereafter, the signals BLC1, BLC4 and DIS are set at L level.

Subsequently, the signals BLC2, BLC3 and XXL are set at H level, and the signal BLC4 is set at L level. Then, the data are taken from the data control unit DCU to the sense amplifier unit SAU. When the data are at L level "0" indicating writing, the gate of the PMOS 24 attains L level, so that the PMOS 24 is turned on. Accordingly, H level "1" is set to the latch circuit LAT1. When the data taken from the data control unit DCU are at H level "1" indicating non-writing, the PMOS 24 is turned off. Accordingly, L level "0" is set to the latch circuit LAT1. In other words, when data are written, the node INV of the latch circuit LAT1 is set at H level. When data are not written, the node INV is set at L level.

Subsequently, the signals BLC1, BLC3, DIS and XXL are set at L level, and the signal BLC2 is set at H level, so that the bit line BL is charged to H level. Thereafter, the signal DIS is set at H level. Then, the node INV of the latch circuit LAT1 is at H level indicating writing, the NMOS 33 is turned on, so that the charge of the bit line BL is discharged via the NMOS 33 and the NMOS 34. When the node INV of the latch circuit LAT1 is at L level indicating non-writing, the potential of the bit line BL is maintained at H level so that the NMOS 33 is turned off.

Thereafter, a select gate line SGD of a select gate transistor S1 connecting a bit line BL and a memory cell MC as shown in FIG. 2 is set at H level, and the potential of the bit line BL is transferred to the channel of the memory cell MC. At the same time, a program voltage Vpgm is applied to a word line WL (selected word line WL) of the selected memory cell MC. Therefore, in a cell to be written, the channel attains L level (Vss), and the selected word line WL attains the program voltage Vpgm, so that the cell is programmed. On the other hand, in a cell not to be written, the channel attains H level (Vdd-Vt: Vt denotes a threshold voltage of a select gate transistor), and the selected word line WL attains the program voltage Vpgm, so that the cell is programmed.

(Read Operation)

When data are read from the memory cell MC, first, the reset signal RST is once set at H level, and the latch circuit LAT1 is reset. Thereafter, the signals BLC1, BLC3, DIS and XXL are set at L level, and the signal BLC2 is set at H level, so that the bit line BL is charged to H level.

Subsequently, the signal BLC2 is set at L level, a reading voltage is applied to the selected word line WL. When the threshold voltage of the memory cell MC is higher than the reading voltage, the memory cell MC is in the OFF state, and the bit line BL is maintained at H level. When the threshold voltage of the memory cell MC is lower than the reading voltage, the memory cell MC is in the ON state, and the charge of the bit line BL is discharged, whereby the bit line attains L level. Then, the signal BLC3 is set at H level, and the voltage of the bit line BL is transferred to the data control unit DCU. As described above, data of a memory cell can be determined.

(Program Verification Operation)

A program verification operation for verifying a threshold voltage of a memory cell MC after program operation is almost the same as the read operation. In this case, the bit line BL is charged to H level, and thereafter, predetermined verifying voltage is applied to the selected word line WL. When the threshold voltage of the memory cell MC reaches the verifying voltage, the memory cell MC is in the OFF state. Accordingly, the voltage of the bit line BL is maintained at H level. When the threshold voltage of the memory cell MC has not yet reached the verifying voltage, the memory cell MC is in the ON state. Therefore, the voltage of the bit line BL is at L level.

In this state, the signals BLC1, BLC2 and XXL are set at H level, and the signals BLC4, BLC3, DIS and RST are set at L level, so that the voltage of the bit line BL is maintained in the latch circuit LAT1. When the threshold voltage of the memory cell MC reaches the verifying voltage, and the voltage of the bit line BL is at H level, the PMOS 24 is in the OFF state. Accordingly, the latch circuit LAT1 is maintained at L level. When the threshold voltage of the memory cell MC has not yet reached the verifying voltage, and the voltage of the bit line BL is at L level, the PMOS 24 is in ON state. Accordingly, the latch circuit LAT1 is maintained at H level. In other words, when the verification is passed, the voltage of the node INV of the latch circuit LAT1 attains L level. When the verification fails, the voltage of the node INV attains H level.

Data in an inversion node INVn of the latch circuit LAT1 are transferred to the data control unit DCU by setting the signal BLC5 at H level and turning on the NMOS 37.

[1-1C] Configuration of Data Control Unit DCU

FIG. 4 is a circuit diagram illustrating an example of configuration of the data control unit DCU. For example, the data control unit DCU includes five data latch circuits; 0DL, 1DL, 2DL, 3DL, 4DL, a bus 41 and a data forming circuit 42. One end of the bus 41 is connected to the sense amplifier unit SAU. The other end of the bus 41 is connected to the data input/output buffer 16 via the column select gates (not shown).

The data latch circuit 0DL includes a latch circuit LAT2 and a transfer gate 43. The latch circuit LAT2 is connected to the bus 41 via the transfer gate 43. The transfer gate 43 is controlled by a signal φ0 and an inversion signal φ0n thereof. Each of the data latch circuits 1DL, 2DL, 3DL and 4DL has the same configuration as the data latch circuit 0DL, but a signal provided to a transfer gate of each data latch circuit is different. Therefore, the data latch circuits 0DL, 1DL, 2DL, 3DL and 4DL can be selectively connected to the bus 41. It should be noted that the number of data latch circuits DL changes according to the embodiment.

The data forming circuit 42 includes a latch circuit LAT3, a PMOSes 51 to 56, NMOSes 61 to 70, and an inverter circuit 71. The source of the PMOS 51 is connected to a node to which the power supply voltage Vdd is provided. A set signal SETT is provided to the gate of the PMOS 51, and the drain of the PMOS 51 is connected to the latch circuit LAT3. The drain of the PMOS 51 is grounded via the NMOS 61, and is also grounded via the NMOSes 62 and 63. A reset signal RST2 is provided to the gate of the NMOS 61. A signal LATH is provided to the gate of the NMOS 62. The gate of the NMOS 63 is connected to the output end of the inverter circuit 71 whose input end is connected to the bus 41. Further, the drain of the PMOS 51 is grounded via the NMOSes 64 and 65. A signal LATL is provided to the gate of the NMOS 64, and the gate of the NMOS 65 is connected to the bus 41.

Between the bus 41 and the node to which the power supply voltage Vdd is provided, the following elements are respectively connected: a series circuit including the PMOSes 52 and 53, a series circuit including the PMOSes 54 and 55, and the PMOS 56. A signal BUSH2 is provided to the gate of the PMOS 52, and the gate of the PMOS 53 is connected to a node LATn of the latch circuit LAT3. The PMOSes 52 and 53 charge the bus 41 to H level in accordance with the potentials of the node LATn of the latch circuit LAT3 and the signal BUSH2.

A signal BUSL2 is provided to the gate of the PMOS 54, and the gate of the PMOS 55 is connected to a node LAT of the latch circuit LAT3. The PMOSes 54 and 55 charge the bus 41 to H level in accordance with the potentials of the node LAT of the latch circuit LAT3 and the signal BUSL2.

A set signal SET2 is provided to the gate of the PMOS 56. The PMOS 56 charges the bus 41 to H level in accordance with the set signal SET2.

Between the bus 41 and ground terminals, the following elements are respectively connected: a series circuit including NMOSes 66 and 67, a series circuit including NMOSes 68 and 69, and an NMOS 70.

A signal BUSH1 is provided to the gate of the NMOS 66, and the gate of the NMOS 67 is connected to a node LATn of the latch circuit LAT3. The NMOSes 66 and 67 discharge the bus 41 to L level in accordance with the potentials of the node LATn of the latch circuit LAT3 and the signal BUSH1.

A signal BUSL1 is provided to the gate of the NMOS 68, and the gate of the NMOS 69 is connected to a node LAT of the latch circuit LAT3. The NMOSes 68 and 69 discharge the bus 41 to L level in accordance with the potentials of the node LAT of the latch circuit LAT3 and the signal BUSL1.

A reset signal RST2 is provided to the gate of the NMOS 70. The NMOS 70 discharges the bus 41 to L level in accordance with the reset signal RST2.

Subsequently, operation of the data control unit DCU will be explained. The data control unit DCU can store data in the data latch circuits 0DL, 1DL, 2DL, 3DL and 4DL, and can process the held data. More specifically, as further explained below, the data control unit DCU is capable of operation corresponding to, for example, logical multiplication "AND", "NAND", logical addition "OR", and inversion with respect to the held data.

(Basic Operation of Data Control Unit DCU)

The basic operation of the data control unit DCU will be explained. Each of 2-bit write data provided from the data input/output buffer 16 is latched in the data latch circuits 1DL and 2DL. In this case, for example, the data latch circuits 1DL and 2DL respectively hold data of a lower page and an upper page. The data in the data latch circuits 0DL, 1DL, 2DL, 3DL and 4DL can be transferred to the bus 41 via the transfer gate 43.

When data of the bus 41 are taken into the latch circuit LAT3, first, the reset signal RST2 is set at H level, so that the NMOSes 61 and 70 are turned on, and the bus 41 and the latch circuit LAT3 are reset to L level.

Subsequently, the set signal SET1 is set at L level, so that the PMOS 51 is turned on, and the latch circuit LAT3 is set at H level. When data are taken into the latch circuit LAT3, first, the latch circuit LAT3 is set at H level. Thereafter, for example, any one of the data latch circuits 0DL to 4DL transfers the data to the bus 41. In this state, the signal LATH is changed to H level. When data of the bus 41 are at H level, the output signal of the inverter circuit 71 attains the low level, so that the NMOS 63 is still in the OFF state. Accordingly, the latch circuit LAT3 is still at H level.

When the bus 41 is at L level, the output signal of the inverter circuit 71 attains H level, so that the NMOS 63 is turned on. Accordingly, the latch circuit LAT3 is discharged via the NMOSes 62 and 63, so that L level is maintained.

Subsequently, operation for inverting data of the bus 41 and taking the inverted data into the latch circuit LAT3 will be explained. When the latch circuit LAT3 is set at H level, any one of the data latch circuits 0DL to 4DL transfers data to the bus 41. Thereafter, the signal LATL is set at H level. When the data of the bus 41 are at H level, the NMOS 65 is turned on. Therefore, the latch circuit LAT3 is discharged via the NMOSes 64 and 65, so that L level is maintained.

When the bus 41 is at L level, the NMOS 65 is still in the OFF state. Accordingly, the latch circuit LAT3 is still at H level.

As described above, the data held in the latch circuit LAT3 are transferred to the data latch circuits 0DL to 4DL, whereby the data in the data latch circuits 0DL to 4DL can be operated.

(Inversion Operation of Data Held in Data Latch Circuit)

Subsequently, an inversion operation for inverting data in the data latch circuits 0DL to 4DL will be explained. First, the bus 41 is charged according to the above operation, and the transfer gate 43 of any one of the data latch circuits 0DL to 4DL is opened. For example, when the transfer gate 43 of the data latch circuit 0DL is opened, and the node DT of the data latch circuit 0DL is at H level, the bus 41 is discharged via a clocked inverter circuit of the data latch circuit 0DL, and the inversion data of the node DT are transferred to the bus 41.

Subsequently, as described above, the LAT3 is reset, and thereafter, the signal SETT is set at L level, and the node LAT of LAT3 is set at H level.

Subsequently, when the signal LATL is at H level, and the bus 41 is discharged by the data in the data latch circuit, the node LAT maintains H level, and when the bus 41 maintains the charged state, the NMOS 65 is turned on, so that the node LAT is discharged to L level.

Subsequently, the bus 41 is charged according to the above operation, and the signal BUSH1 is set at H level. Then, when the node LAT of the latch circuit LAT3 is at H level (node LATn is at L level), the bus 41 maintains H level. When the node LAT is at L level (node LATn is at H level), the bus 41 is at L level.

Finally, the latch circuit LAT2 of the data latch circuit 0DL is reset, and thereafter the transfer gate 43 is opened, so that the data of the bus 41 are taken into the latch circuit LAT2 via the transfer gate 43. As a result, when the data of the bus 41 are at H level, the node DT of the latch circuit LAT2 attains L level, and when the data of the bus 41 are at L level, the node DT attains H level.

The above series of operations will now be summarized. The inversion data of the node DT of the latch circuit LAT2 are transferred to the bus 41, and the inversion data are transferred to the latch circuit LAT3. Subsequently, the data in the latch circuit LAT3 are transferred to the bus 41, and the inversion data of the bus 41 are held in the latch circuit LAT2. As described above, the nodes DT of the data latch circuits 0DL to 4DL are inverted.

It should be noted that the basic operation of the data control unit DCU is not limited thereto. This may be achieved by other operations. "AND", "NAND" and "OR" operations can be performed on data using the above operation as a basis.

[1-2] Operation of NAND Flash Memory 1

The first embodiment is an example of a NAND flash memory in which one memory cell MC can store 1-bit data (binary data). A write method capable of reducing an inter-cell interference effect that is also effective for a binary write operation (hereinafter, a single-level write operation) is desired. When data are written to a memory cell connected to the n-th selected word line WLn (n is an integer of 0 or more) with respect to the source (which may also be hereinafter referred to as "data are written to the word line WLn"), and thereafter data are written to an adjacent word line WLn+1 adjacent to the drain of WLn, WLn is greatly affected by inter-cell interference from WLn+1, and the threshold value distribution may be expanded. In the first embodiment, when data are written to WLn by a single-level write operation, a program voltage is once applied to WLn+1 and then data are written (programmed) to WLn in order to alleviate the above problem.

Figure 5:
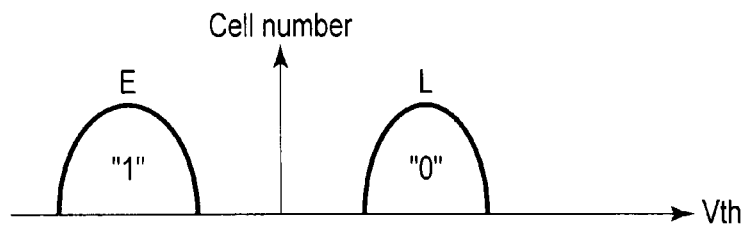
FIG. 5 is a view illustrating a threshold value distribution of a memory cell MC in single-level storage method.

FIG. 5 is a view illustrating a threshold value distribution of a memory cell MC in a single-level storage method. A threshold voltage Vth of a memory cell MC can be set at "E" level and "L" level. Data are assigned such as E=1, L=0. "E" level is an erased state in which the threshold voltage of the memory cell MC is the lowest (for example, negative threshold voltage). "L" level is a "0" write state in which electrons are injected into the charge storage layer and the threshold voltage of the memory cell MC attains a level higher than "E" level.

Data are erased in units of blocks. All the word lines in the selected block are set at 0V, and an erasing voltage Vera (for example, 20V) is applied to the P-type well in which the memory cell array is formed. Accordingly, electrons of the charge storage layer are discharged from all the memory cells in the selected block, so that a negative threshold voltage ("E" level) is attained.

Write data loaded to the latch circuit LAT1 of the sense amplifier unit SAU are either data "0" (write) or "1" (write prohibition). According to the write data, the channel voltage of the NAND string is set to either Vss, Vdd-Vt (Vt is the threshold voltage of the select gate transistor) via the bit line in accordance with either "0", "1" writing. Then, the program voltage Vpgm is applied to the selected word line, so that electron injection occurs in a write cell, and electron injection does not occur in a write prohibition cell. Therefore, the threshold voltage of the memory cell can be selectively increased within the same page.

Figure 6:
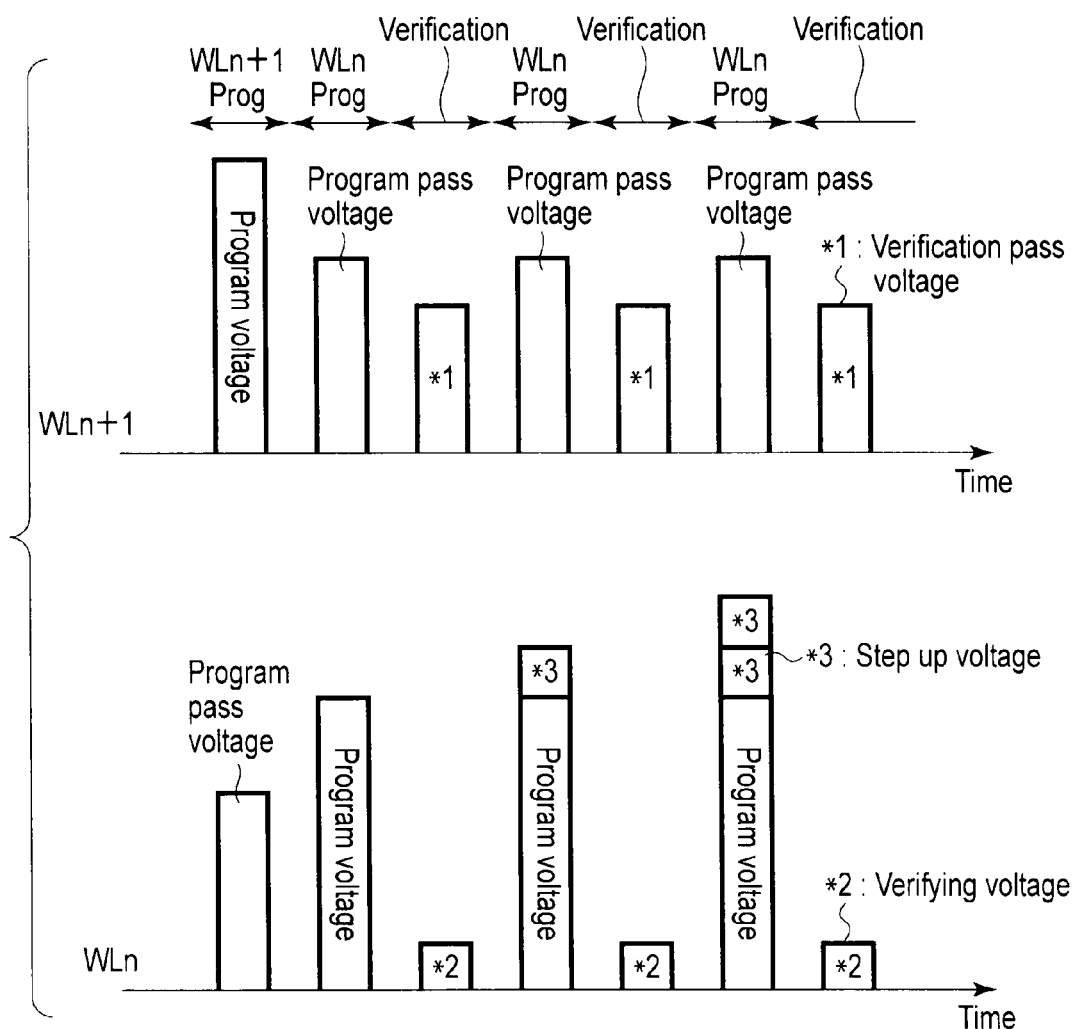
FIG. 6 is a view illustrating a voltage relationship during programming according to the first embodiment.

FIG. 6 is a view illustrating voltage relationship applied to a word line during programming. FIG. 6 shows the selected word line WLn and the adjacent word line WLn+1 adjacent to the drain of WLn.

As shown in FIG. 6, in the program sequence of the selected word line WLn, the program voltage is applied only once (only one pulse of the program voltage is applied) to the word line WLn+1 immediately before the first program voltage is applied to the selected word line WLn. Thereafter, the program operation is executed on the selected word line WLn. More specifically, application of the program voltage and verification operation for verifying the threshold voltage of the memory cell MC are repeated until the verification is passed (successfully completed). At this occasion, the program voltage is stepped up.

As a result of the above control, before the word line WLn is programmed, the threshold value distribution of the memory cell connected to the word line WLn+1 is set at a value somewhat close to the threshold voltage finally programmed. Therefore, the inter-cell interference effect caused by the word line WLn+1, i.e., a primary factor for expanding the threshold value distribution of WLn, can be reduced. In the present embodiment, the "program sequence of selected word line WLn" includes a series of operations for completing a write operation to the selected word line WLn. More specifically, this includes pulse application to the adjacent word line WLn+1, a plurality of program voltage applications to the selected word line WLn, and the verification operation corresponding thereto.

During the program operation, the program voltage is applied to the word line to be programmed, and a program pass voltage for prohibiting programming is applied to the other word lines. During the verification operation, the verifying voltage is applied to the word line to be verified, and a verification pass voltage for turning on the memory cell regardless of the threshold voltage is applied to the other word lines.

FIG. 7 is a flowchart illustrating a program sequence according to the first embodiment. FIGS. 8 and 9 are views illustrating the correspondence between word line levels ("E" level and "L" level) and latch data of the data latch circuit DL and the sense amplifier unit SAU.

First, data to be programmed in the selected word line WLn are loaded from the outside via the input/output control circuit 15, and are once latched in the data latch circuit 0DL. Then, data in the data latch circuit 0DL are transferred to the data latch circuit 1DL (step S100). The data latch circuit 0DL is used as a cache (buffer).

Subsequently, data to be programmed to the adjacent word line WLn+1 adjacent to the drain of the word line WLn are loaded from the outside via the input/output control circuit 15, and are once latched in the data latch circuit 0DL. Then, the data in the data latch circuit 0DL are transferred to the data latch circuit 2DL (step S101). If necessary, the data latch circuit 0DL is reset so that it can be used for other operations. At this moment, the data needed for programming the selected word line WLn have already been prepared, and the latch data are as shown in FIG. 8(1).

Subsequently, the data in the word line WLn+1 are transferred from the data latch circuit 2DL to the sense amplifier unit SAU, and one pulse of program voltage is applied to the word line WLn+1 (step S102). In this state, the threshold voltage in the adjacent word line WLn+1 is set at a value somewhat close to the threshold voltage finally programmed. The latch data in step S102 are as shown in FIG. 8(2). When a program voltage is applied, a bit line control circuit 12 is selectively charging bit lines.

Subsequently, the data in the word line WLn are transferred from the data latch circuit 1DL to the sense amplifier unit SAU, and the word line WLn is programmed (step S103). The latch data in step S103 are as shown in FIG. 8(3). In step S103, as shown in FIG. 6, the verification operations are included, and until the verification operation is passed, the program voltage is successively increased by a step up voltage, and the application of the program voltage and the verification operation are repeated. At this moment, the following steps have been achieved. When the word line WLn is programmed, one pulse of program voltage is applied to the word line WLn+1, and then the word line WLn is programmed.

In steps S104 to S107, when the selected word line WLn+1 is programmed, one pulse of program voltage is applied to the adjacent word line WLn+2 adjacent to the drain of the word line WLn+1. First, the data in the word line WLn+1 are transferred from the data latch circuit 2DL to the data latch circuit 1DL (step S104). In step S104, when the word line WLn is programmed, the data in the word line WLn+1 are already loaded, and therefore, it is not necessary to load them again.

Subsequently, data to be programmed in the word line WLn+2 are loaded from the outside via the input/output control circuit 15, and are once latched in the data latch circuit 0DL. Then, the data in the data latch circuit 0DL are transferred to the data latch circuit 2DL (step S105). If necessary, the data latch circuit 0DL is reset so that it can be used for other operations. At this moment, the data needed for programming the selected word line WLn+1 have already been prepared, and the latch data are as shown in FIG. 9(1).

Subsequently, the data in the word line WLn+2 are transferred from the data latch circuit 2DL to the sense amplifier unit SAU, and one pulse of program voltage is applied to the word line WLn+2 (step S106). In this state, the threshold voltage in the word line WLn+2 is set at a value somewhat close to the threshold voltage finally programmed. The latch data in step S106 are as shown in FIG. 9(2).

Subsequently, the data in the word line WLn+1 are transferred from the data latch circuit 1DL to the sense amplifier unit SAU, and the word line WLn is programmed (step S107). The latch data in step S107 are as shown in FIG. 9(3). At this moment, the following steps have been achieved. When the word line WLn+1 is programmed, one pulse of program voltage is applied to the word line WLn+2, and then the word line WLn+1 is programmed.

Likewise, the word line WLn+1 and subsequent word lines can be programmed by repeatedly using the flow from steps S104 to S107. If the data latch circuit 0DL is not used for other operations, it is sufficient to prepare two data latch circuits, i.e., one for data in the word line WLn and one for data in the word line WLn+1, and therefore, two data latch circuits are sufficient. In this case, the number of data latch circuits can be reduced to two. As a result, the size of the area of the circuit is smaller than the size of the area of a circuit with three or more data latch circuits.

[1-3] Modification

Figure 10:
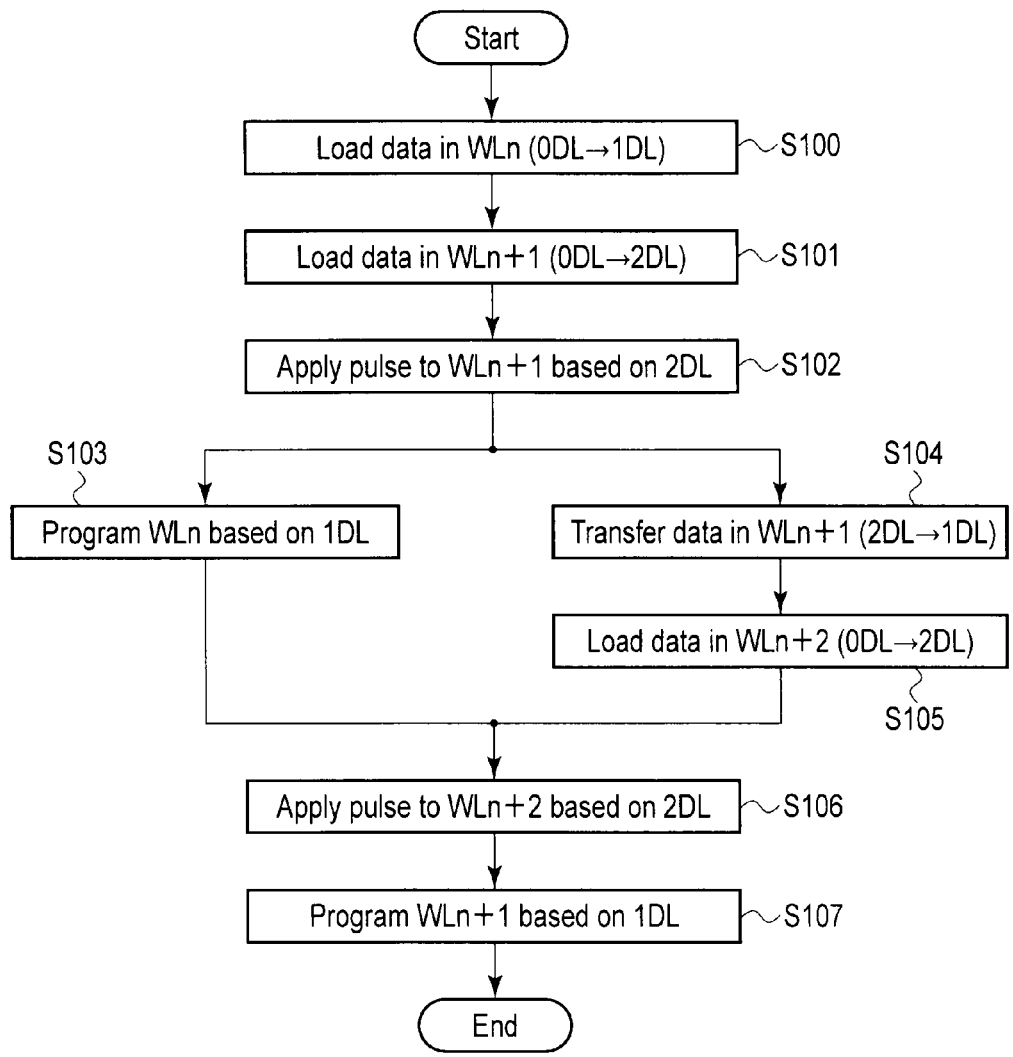
FIG. 10 is a flowchart illustrating a program sequence according to a modification.

Programming of the selected word line and loading operation of data may be performed in parallel. FIG. 10 is a flowchart illustrating a program sequence according to a modification of the first embodiment.

In parallel with the program operation in step S103, the data loading operations from steps S104 to S105 are performed. In this modification, three data latch circuits are required.

A function requiring extra data latch circuits cannot be used at the same time when there are only three data latch circuits. Therefore, the number of data latch circuits is increased when the data latch circuit 0DL is used for other operations.

Figure 11:
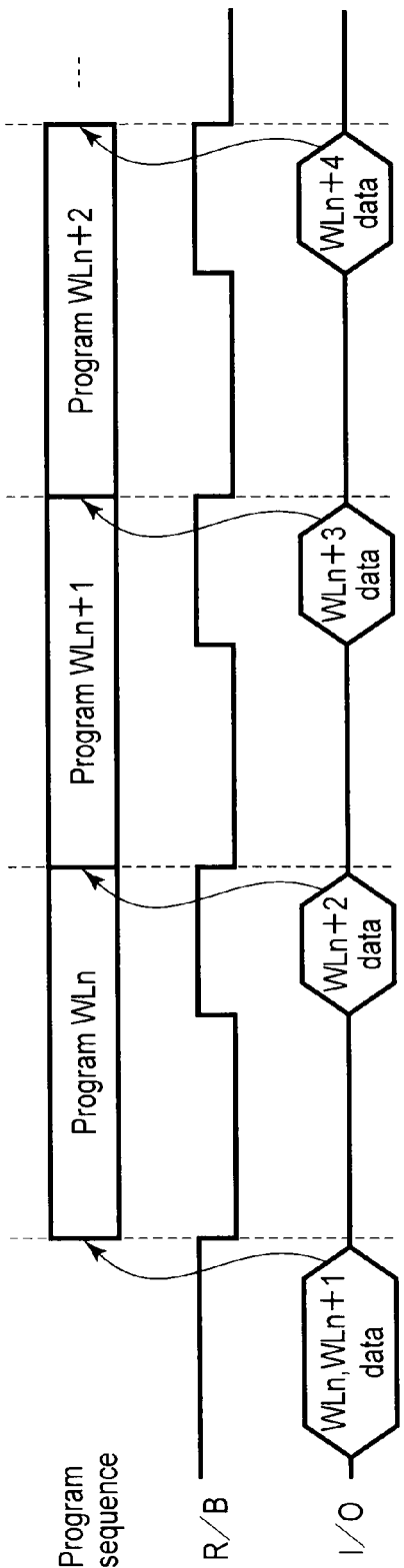
FIG. 11 is a timing chart illustrating a program sequence according to the modification.

FIG. 11 is a timing chart illustrating a program sequence according to the modification of the first embodiment. In a ready state, i.e., the ready/busy signal R/B is at a high level, the input/output control circuit (I/O) 15 loads data. Then, the program sequence and the data loading operation are performed in parallel. By achieving the above flow, the speed of the program operation can be increased.

[1-4] Effect

As hereinabove explained in detail, in the first embodiment, first, one pulse of writing voltage is applied to the adjacent word line WLn+1 which is adjacent to the drain of the selected word line WLn in the program sequence of the selected word line WLn. In this state, the threshold voltage in the adjacent word line WLn+1 is set at a value somewhat close to the threshold voltage finally programmed. Thereafter, an operation for applying the program voltage to the selected word line WLn and the verification operation are repeated, whereby the selected word line WLn is programmed.

Therefore, according to the first embodiment, the selected word line WLn can be programmed while the inter-cell interference effect is received from the adjacent word line WLn+1. Therefore, when the program is finally completed, it is possible to reduce the inter-cell interference effect that the selected word line WLn receives from the adjacent word line WLn+1, and further, reading error can be reduced.

Further, the threshold value distribution of the selected word line WLn can be reduced. Therefore, since the reading error can be reduced, the NAND flash memory capable of reliably storing data can be realized.

Even when parasitic capacitances between adjacent bit lines and between memory cells increase as the sizes of memories decrease, the NAND flash memory capable of reliably storing data can be realized.

In the first embodiment, after one pulse of writing voltage is applied to the adjacent word line WLn+1, the adjacent word line WLn+1 is not verified. Therefore, it is not necessary to input data for verification again. Therefore, the program time of the selected word line WLn does not increase greatly. For example, when the adjacent word line WLn+1 is verified, it is necessary to perform the application operation of the program voltage multiple times. In this case, it takes a much longer time to perform the write operation.

In the explanation about the first embodiment, the program voltage is applied to the word line WLn+1 adjacent to the selected word line WLn. However, the embodiment is not limited thereto. Alternatively, in the program sequence of the word line WLn, the program voltage may be applied to a word line away from the word line WLn by one or more lines.

[2] Second Embodiment

The second embodiment is a program method for reducing the inter-cell interference effect occurring in a NAND flash memory having a memory cell capable of storing multi-level data such as 2- or more-bit data.

In the second embodiment, a memory cell capable of storing 2-bit data (4-value data) as multi-level data will be explained as an example. FIG. 12 is a view illustrating a threshold value distribution of a memory cell MC in a four-level storage method.

Four-value data are represented by "xy" including an upper page data "x" and a lower page data "y". In this case, data such as E=11, A=01, B=00, C=10 are assigned.

In FIG. 12(1), "E" level is an erased state in which the threshold voltage of the memory cell MC is the lowest (for example, negative threshold voltage). FIG. 12(2) shows a threshold value distribution when the lower page is programmed. In FIG. 12(2), a threshold voltage Vth of a memory cell MC is set at one of "E" level and "L" level.

In the four-level storage method, a lower page program and an upper page program are needed to program data. The lower page program is an operation for selectively changing the memory cells from "E" level to "L" level. The upper page program includes a first upper page program and a second upper page program. The first upper page program selectively changes the memory cells from "E" level to "A" level. The second upper page program selectively changes the memory cells from "L" level to "B" level and "C" level. In these two kinds of upper page write operations, "0", "1" write data are selectively given to bit lines of a selected page within one sequence, so that program voltages are applied to word lines at a time.

Subsequently, the program order of the multi-level program will be explained. FIG. 13 is a view illustrating the program order. Numbers in FIG. 13 represent the order of program.

As shown in FIG. 13, the programming is performed in the order listed below. (1) The lower page in the word line WL0 is programmed. (2) The lower page in the word line WL1 is programmed. (3) The upper page in the word line WL0 is programmed. (4) The lower page in the word line WL2 is programmed. When the programming is thus performed, the inter-cell interference effect caused by the lower page data can be reduced. The subsequent program order will be considered with reference to FIG. 13.

[2-1] Operation of NAND Flash Memory 1

Figure 14:
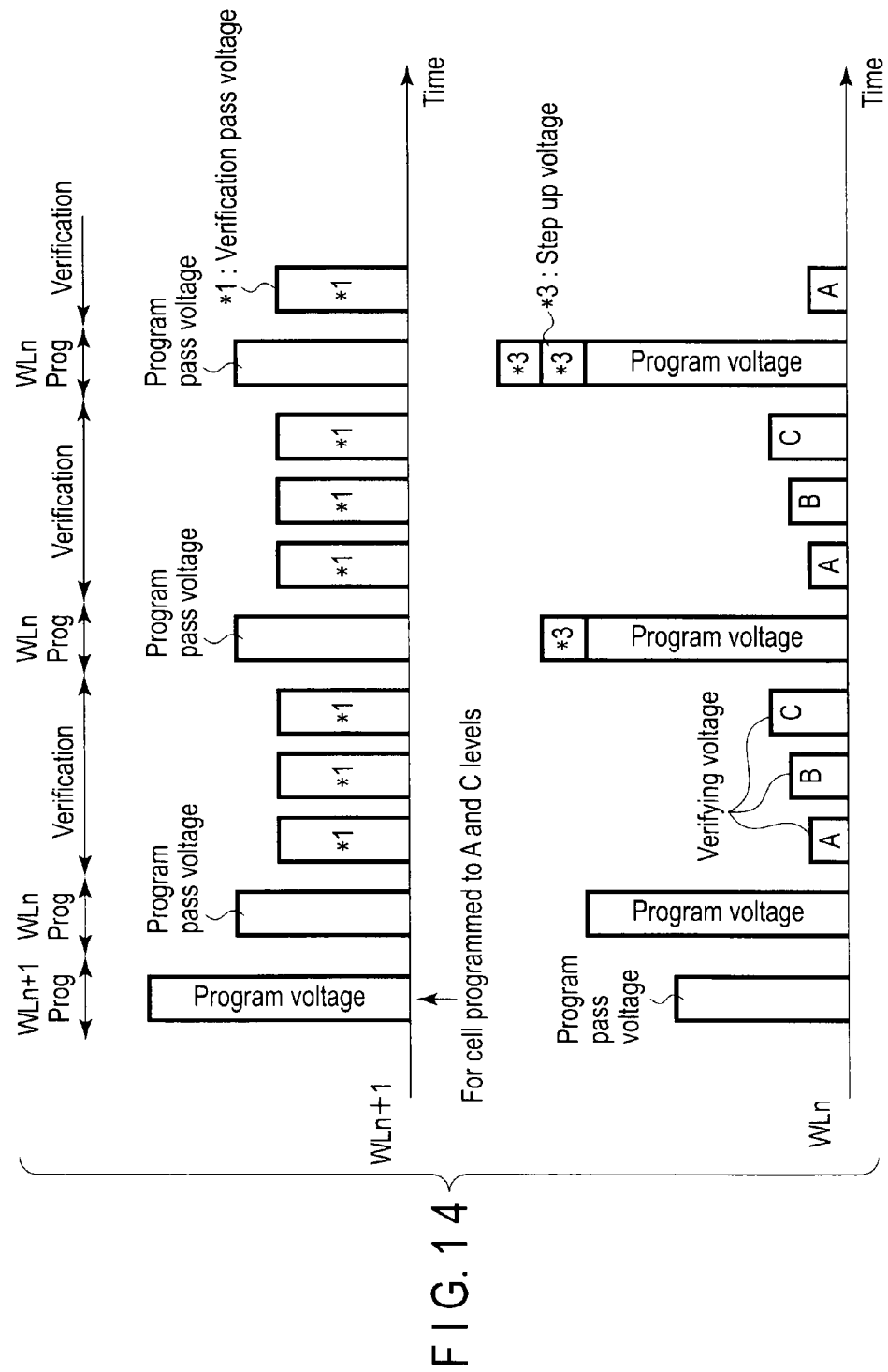
FIG. 14 is a view illustrating a voltage relationship during programming according to the second embodiment.

FIG. 14 is a view illustrating a voltage relationship applied to a word line during programming. FIG. 14 shows the selected word line WLn and the adjacent word line WLn+1 adjacent to the drain of the word line WLn.

When memory cells in the word line WLn+1 are programmed to "A" level and "C" level, the threshold voltages of the memory cells greatly change, and the memory cells in the word line WLn are greatly affected by the inter-cell interference effect. In the second embodiment, when the word line WLn is programmed, a program voltage for multi-level data is also applied to the word line WLn+1, thus reducing the inter-cell interference effect that the word line WLn receives from the word line WLn+1.

As shown in FIG. 14, immediately before the upper page in the word line WLn is programmed, one pulse of program voltage is applied to the word line WLn+1 using the lower data and the upper data of the word line WLn+1, so that the memory cells to be set to "A" level and "C" level among the memory cells connected to the word line WLn+1 are programmed. The bit line control circuit 12 controls selective programming performed only on the cells at "A" level and "C" level. Thereafter, the upper page in the word line WLn is programmed (including verification). According to the above operation, it is possible to reduce the inter-cell interference effect that the memory cells in the word line WLn are expected to receive from the memory cells programmed to "A" level and "C" level in the word line WLn+1 after the program of the word line WLn is completed.

Figure 15:
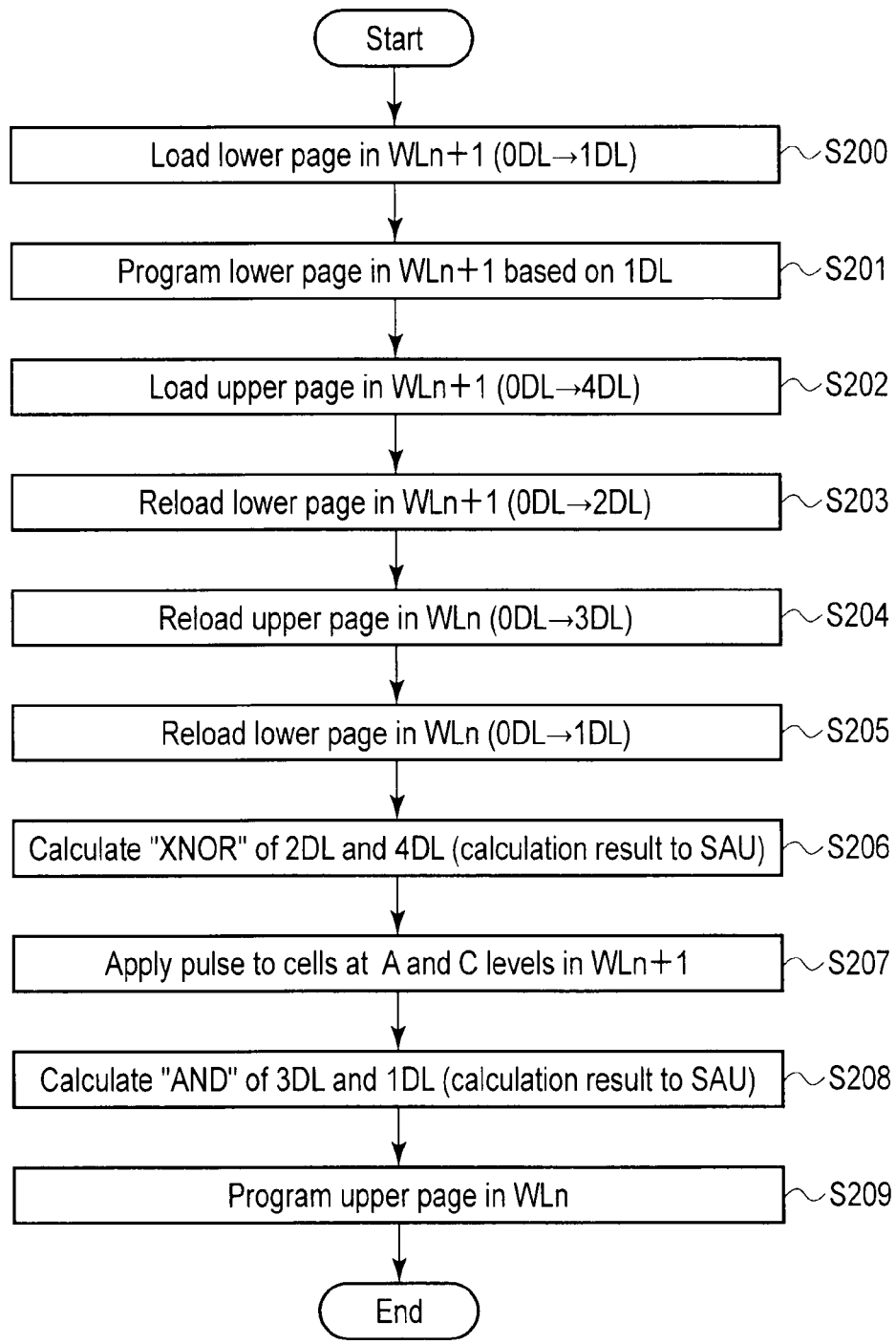
FIG. 15 is a flowchart illustrating a program sequence according to the second embodiment.

FIG. 15 is a flowchart illustrating a program sequence according to the second embodiment. FIG. 16 is a view illustrating the correspondence between word line levels ("E" level, "A" level, "B" level and "C" level) and latch data of the data latch circuit DL and the sense amplifier unit SAU.

First, an ordinary lower page program is performed on the word line WLn+1. In other words, lower page data to be programmed in the word line WLn+1 are loaded from the outside via the input/output control circuit 15, and are once (temporally) latched in the data latch circuit 0DL. Then, data in the data latch circuit 0DL are transferred to the data latch circuit 1DL (step S200). If necessary, the data latch circuit 0DL is reset so that it can be used for other operations. The latch data in step S200 are as shown in FIG. 16(1).

Subsequently, the lower page data in the word line WLn+1 are transferred from the data latch circuit 1DL to the sense amplifier unit SAU, and the lower page in the word line WLn+1 is programmed (step S201). The latch data in step S201 are as shown in FIG. 16(2).

Subsequently, data for programming the upper page in the word line WLn will be prepared. In other words, upper page data to be programmed in the word line WLn+1 are loaded from the outside via the input/output control circuit 15, and are transferred to the data latch circuit 4DL via the data latch circuit 0DL (step S202). Subsequently, the lower page data to be programmed in the word line WLn+1 are loaded again, and are transferred to the data latch circuit 2DL via the data latch circuit 0DL (step S203). In step S203, the lower page data in the word line WLn+1 have already been programmed. Accordingly, the data in the word line WLn+1 may be read to the sense amplifier unit SAU, and the data may be transferred to the data latch circuit 2DL.

Subsequently, the upper page data to be programmed in the word line WLn are loaded again, and are transferred to the data latch circuit 3DL via the data latch circuit 0DL (step S204). The reason why the data are loaded again in step S204 is because the data were once loaded when the word line WLn−1 was programmed. In step S202, program data of a previous stage still remain in the data latch circuit 4DL, and accordingly the data in the data latch circuit 4DL may be transferred to the data latch circuit 3DL.

Subsequently, the lower page data to be programmed in the word line WLn are loaded again, and are transferred to the data latch circuit 1DL via the data latch circuit 0DL (step S205). In step S205, the lower page data in the word line WLn have already been programmed. Accordingly, the data in the word line WLn may be read to the sense amplifier unit SAU, and the data may be transferred to the data latch circuit 1DL. Alternatively, program data of a previous stage still remain in the data latch circuit 2DL, and accordingly the data in the data latch circuit 2DL may be transferred to the data latch circuit 1DL.

At this moment, data for programming the upper page in the word line WLn have been prepared. When the lower page programming is finished in the word line WLn+1, the upper page programming in the word line WLn is subsequently performed according to the order of writing as shown in FIG. 13. However, before that, it is desired to apply the program voltage to the memory cell having write data of "A" level and "C" level in the word line WLn+1, and accordingly, write data for this will be prepared. Therefore, XNOR of 2DL and 4DL is calculated (step S206). In order to calculate XNOR, XNOR cannot be calculated at a time using the latch operation as explained above, and it is necessary to once record intermediate data during calculation to the data latch. Therefore, the data latch circuit 0DL is used this time. It should be noted that, at this moment, it is necessary to prepare one more data latch circuit DL when the data latch circuit 0DL is used for other purposes. The result of XNOR calculation is transferred to the sense amplifier unit SAU. If necessary, the data latch circuit 0DL is reset so that it can be used for other operations.

FIG. 16(3) shows a state where the sense amplifier unit SAU has prepared write data for a memory cell to be set to "A" level and "C" level in the word line WLn+1. Using data of the sense amplifier unit SAU, one pulse of program voltage is applied to the memory cells to be set to "A" level and "C" level in the word line WLn+1 (step S207). In this state, the threshold voltage of the memory cell to be set to "A" level and "C" level in the word line WLn+1 is set at a value somewhat close to the threshold voltage finally programmed.

Subsequently, the upper page data in the word line WLn are generated by calculating AND of 1DL and 3DL, and this calculation result is transferred to the sense amplifier unit SAU (step S208). The latch data in step S208 are as shown in FIG. 16(4). Subsequently, the upper page in the word line WLn is programmed (including verification) (step S209). At this moment, the following steps have been achieved. When the upper page in the word line WLn is programmed, one pulse of program voltage is applied to the memory cell at "A" level and "C" level in the word line WLn+1, and then the upper page in the word line WLn is programmed. Likewise, the upper pages in the word line WLn+1 and subsequent word lines can be programmed by repeatedly using the flow shown in FIG. 15.

As described in the second embodiment, when a multi-level program method is implemented, better effects are expected when a program voltage applied first is selected as a somewhat moderately large value by combining the method using information about actual write characteristics.

[2-2] Modification

In multi-level, after the word line WLn−1 is programmed, the word line WLn is programmed. This situation will be considered. When the word line WLn is programmed, two inter-cell interference effects are applied. The two inter-cell interference effects include an inter-cell interference effect caused by programming of the word line WLn−1 and, and an inter-cell interference effect caused by the memory cell having write data of "A" level and "C" level in the word line WLn+1. Therefore, the word line WLn may be written overly.

In order to solve this, the word line WLn is verified before the program voltage is applied to the word line WLn as shown in FIG. 17. Therefore, the memory cell that has been successfully verified first is not programmed, and this prevents excessive writing to the word line WLn.

[2-3] Effects

As hereinabove explained in detail, in the second embodiment, first, one pulse of upper page program voltage is applied to the adjacent word line WLn+1 which is adjacent to the drain of the selected word line WLn in the sequence for programming the upper page in the selected word line WLn. In this state, the threshold voltage in the adjacent word line WLn+1 is set at a value somewhat close to the threshold voltage finally programmed. Thereafter, an operation for applying the program voltage and the verification operation are repeated, whereby the upper page in the selected word line WLn is programmed.

Therefore, according to the second embodiment, the upper page in the selected word line WLn can be programmed while the inter-cell interference effect is received from the adjacent word line WLn+1. Therefore, when the program is finally completed, it is possible to reduce the inter-cell interference effect that the selected word line WLn receives from the adjacent word line WLn+1 in the NAND flash memory capable of storing multi-level data. The effects other than the above are the same as those of the first embodiment.

When verification is performed during programming, data used for programming are destroyed. In the second embodiment, verification is not performed when one pulse of writing voltage is applied to the word line WLn+1, and therefore, the lower page data and the upper page data in the word line WLn+1 latched in the data latch circuit DL are not destroyed. Therefore, when the word line WLn+1 is programmed in a subsequent program sequence, data latched in the data latch circuit DL can be used. Therefore, it takes a shorter time to transfer data than loading data from the outside again, and further, the program time can be reduced. When data to be loaded are data that have already been programmed, the data may be read from the memory cell array. Also in this case, it takes a shorter time to transfer data than loading data from the outside again.

In the explanation about the second embodiment, the program voltage is applied to the word line WLn+1 adjacent to the selected word line WLn. However, the embodiment is not limited thereto. Alternatively, in the program sequence of the word line WLn, the program voltage may be applied to a word line away from the word line WLn by one or more lines.

[3] Third embodiment

The third embodiment is configured to reduce the inter-cell interference effect that the selected word line WLn receives from two word lines WLn+1 and WLn+2 adjacent to the drain of the selected word line WLn.

[3-1] Operation of NAND Flash Memory 1

Figure 18:
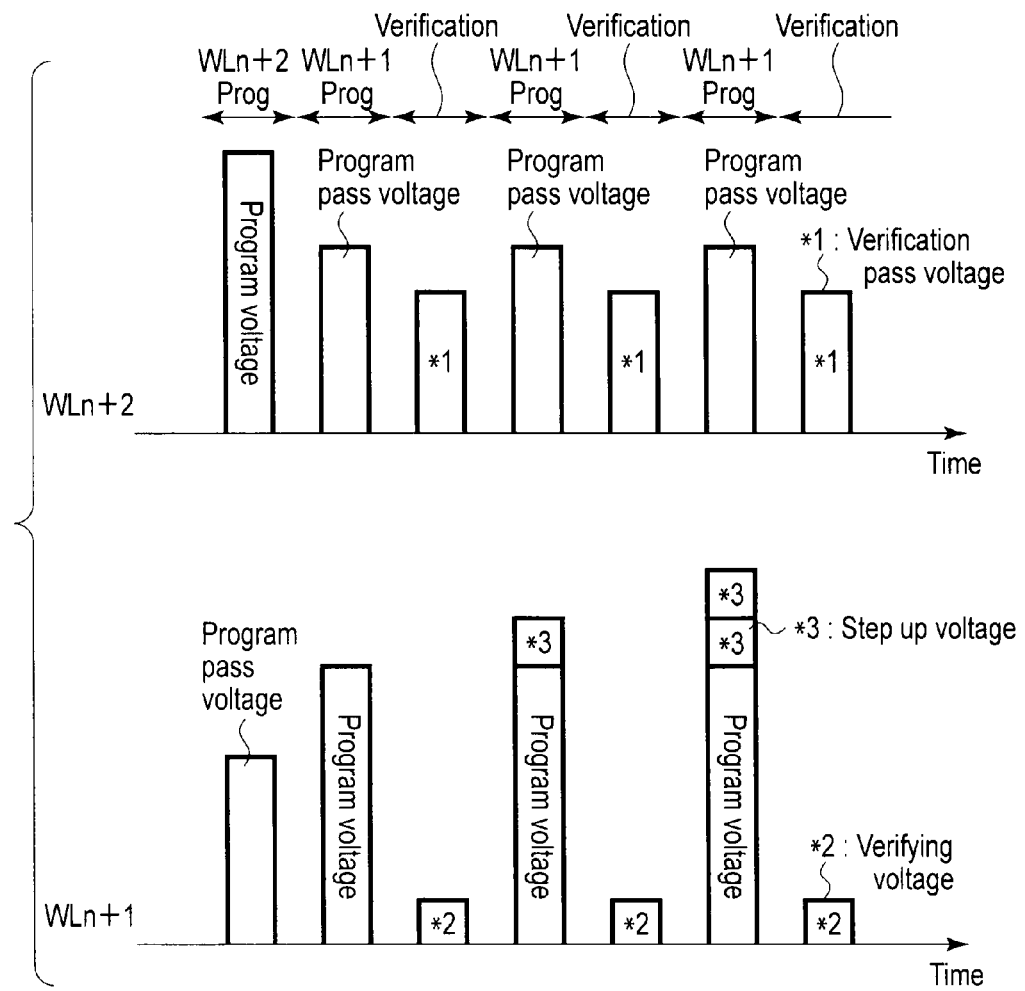
FIG. 18 is a view illustrating a voltage relationship during programming according to the third embodiment.

FIG. 18 is a view illustrating a voltage relationship applied to a word line during programming. FIG. 18 shows two word lines WLn+1, WLn+2 adjacent to the drain of the word line WLn.

As shown in FIG. 18, one pulse of program voltage is applied to the word line WLn+2 immediately before the lower page in the word line WLn+1 is programmed. Subsequently, the lower page in the word line WLn+1 is programmed (including verification). Thereafter, the upper page in the word line WLn is programmed (including verification). According to the above operation, it is possible to reduce the inter-cell interference effect that the memory cells in the word line WLn are expected to receive from the word line WLn+2 in which the lower page is programmed after the program of the word line WLn is completed.

Figure 19:
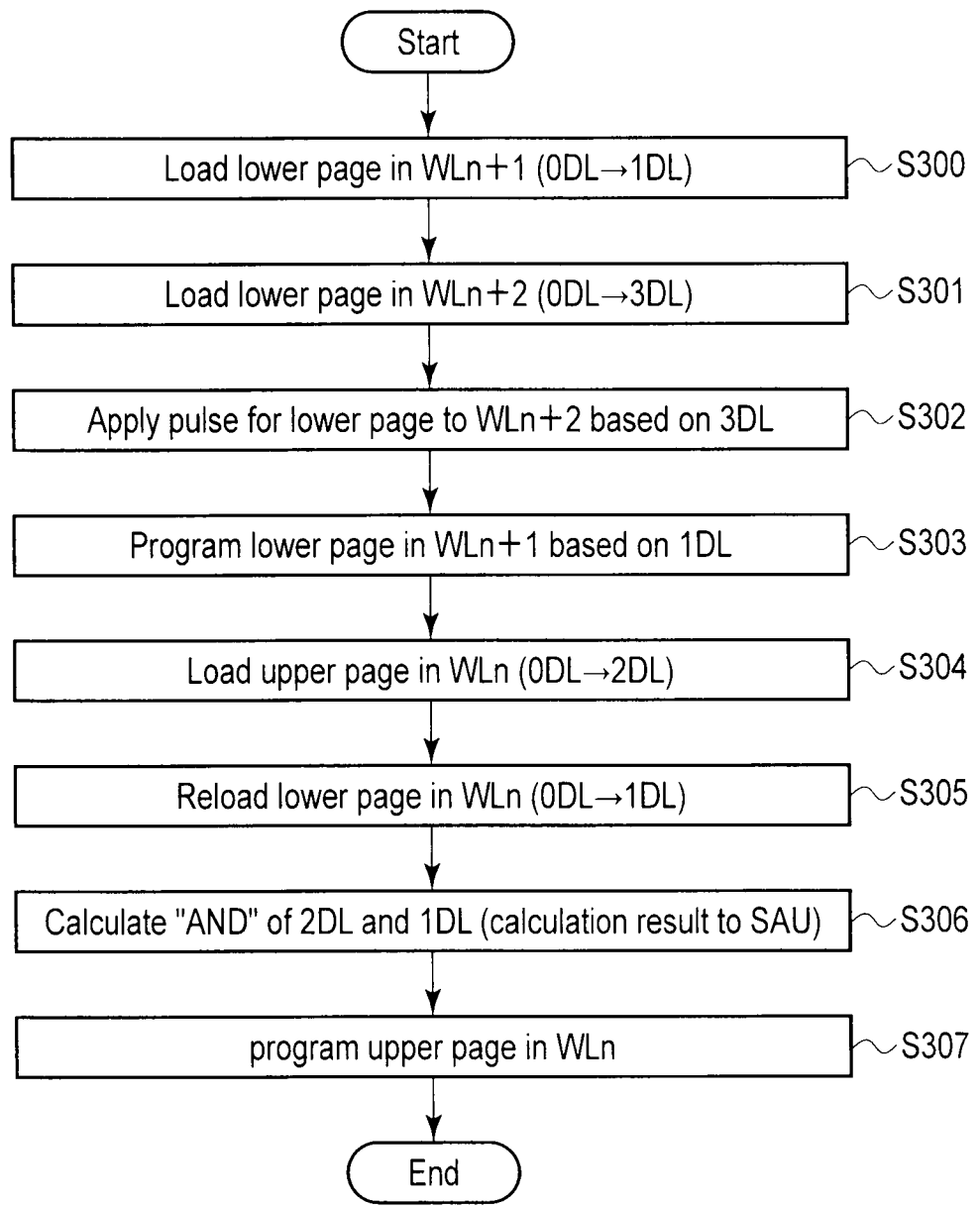
FIG. 19 is a flowchart illustrating a program sequence according to the third embodiment.
Figure 20:
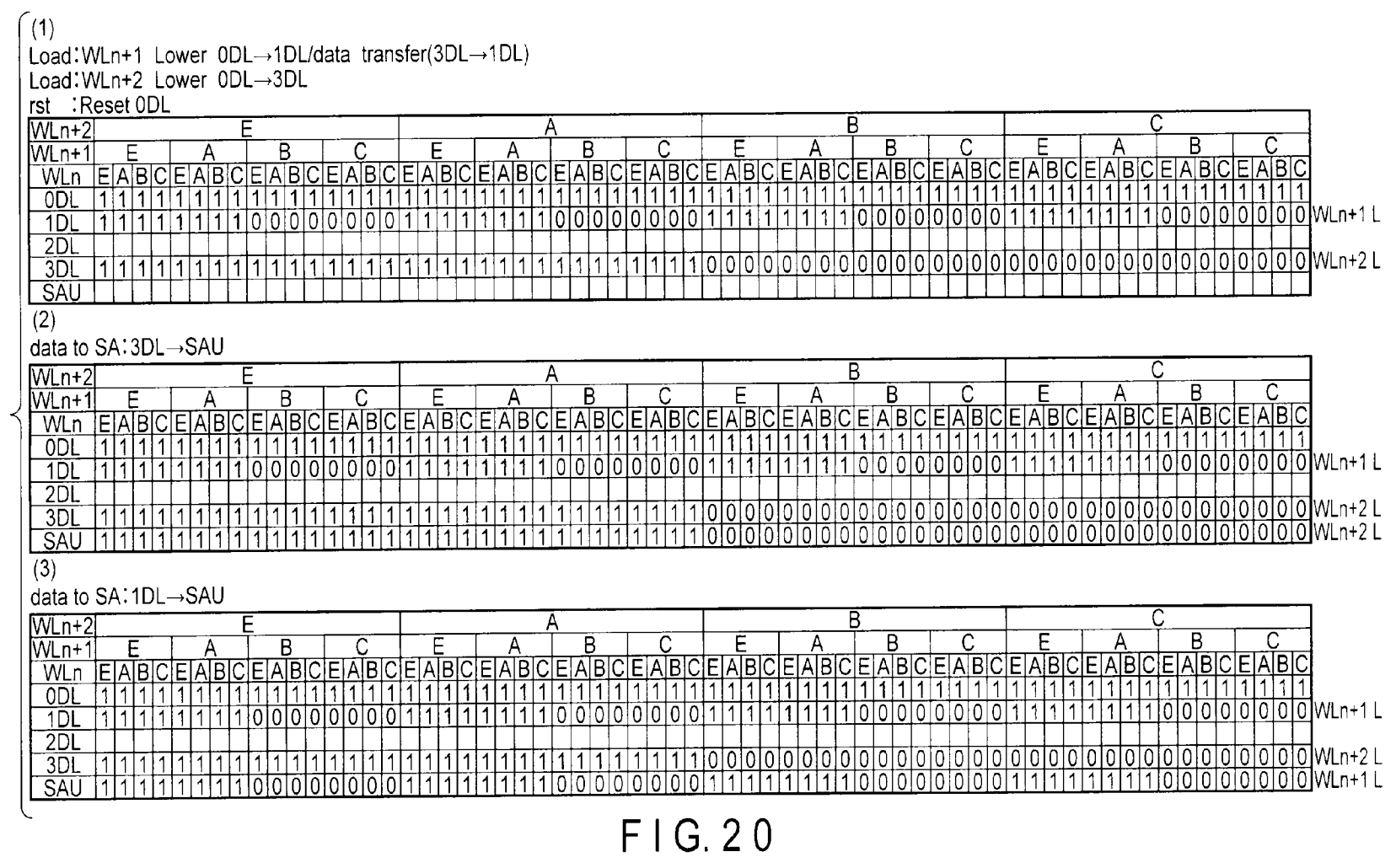

FIG. 19 is a flowchart illustrating a program sequence according to the third embodiment. FIG. 20 is a view illustrating the correspondence between word line levels ("E" level, "A" level, "B" level and "C" level) and latch data of the data latch circuit DL and the sense amplifier unit SAU.

First, lower page data to be programmed in the word line WLn+1 are loaded from the outside via the input/output control circuit 15, and are once latched in the data latch circuit 0DL. Then, data in the data latch circuit 0DL are transferred to the data latch circuit 1DL (step S300). In step S300, in the program sequence of a previous stage, the lower page data in the word line WLn+1 still remain in the data latch circuit 3DL, and accordingly the data in the data latch circuit 3DL may be transferred to the data latch circuit 1DL.

Subsequently, lower page data to be programmed in the word line WLn+2 are loaded from the outside via the input/output control circuit 15, and are once latched in the data latch circuit 0DL. Then, data in the data latch circuit 0DL are transferred to the data latch circuit 3DL (step S301). If necessary, the data latch circuit 0DL is reset so that it can be used for other operations. At this moment, data for programming the lower page in the word line WLn+1 have been prepared. The latch data in step S301 are as shown in FIG. 20(1).

Subsequently, the lower page data in the word line WLn+2 are transferred from the data latch circuit 3DL to the sense amplifier unit SAU, and one pulse of program voltage for lower page is applied to the word line WLn+2 (step S302). The latch data in step S302 are as shown in FIG. 20(2).

Subsequently, the lower page data in the word line WLn+1 are transferred from the data latch circuit 1DL to the sense amplifier unit SAU, and the lower page in the word line WLn+1 is programmed (including verification) (step S303). The latch data in step S303 are as shown in FIG. 20(3). At this moment, the following steps have been achieved. When the lower page in the word line WLn+1 is programmed, one pulse of program voltage for lower page is applied to the word line WLn+2, and then the lower page in the word line WLn+1 is programmed.

Subsequently, the upper page data to be programmed in the word line WLn are loaded, and are transferred to the data latch circuit 2DL via the data latch circuit 0DL (step S304). Subsequently, the lower page data to be programmed in the word Line WLn are loaded again, and are transferred to the data latch circuit 1DL via the data latch circuit 0DL (step S305). In step S305, the lower page data in the word line WLn have already been programmed. Accordingly, the data in the word line WLn may be read to the sense amplifier unit SAU, and the data may be transferred to the data latch circuit 1DL.

At this moment, data for programming the upper page in the word line WLn have been prepared. Subsequently, the upper page data in the word line WLn are generated by calculating AND of 2DL and 1DL, and this calculation result is transferred to the sense amplifier unit SAU (step S306). Subsequently, the upper page in the word line WLn is programmed (including verification) (step S307). Therefore, it is possible to reduce a portion of the inter-cell interference effect that the word line WLn receives from the word line WLn+2.

Further, in the third embodiment, only the lower page data in the word line WLn+2 are used. Alternatively, the word line WLn may be programmed after one pulse of program voltage is applied to the memory cell at "A" level and "C" level in the word line WLn+2 by also using the upper page data in the word line WLn+2. In this case, it is necessary to prepare data latch circuits for the upper page in the word line WLn, the lower page in the word line WLn+1, the upper page in the word line WLn+1, the lower page in the word line WLn+2, and the upper page in the word line WLn+2.

[3-2] First Modification

In the flowchart of FIG. 19, one pulse of program voltage is applied to the word line WLn+2 immediately before the lower page in the word line WLn+1 is programmed. Alternatively, one pulse of program voltage may be applied to the word line WLn+2 immediately before the upper page in the word line WLn is programmed.

Figure 21:
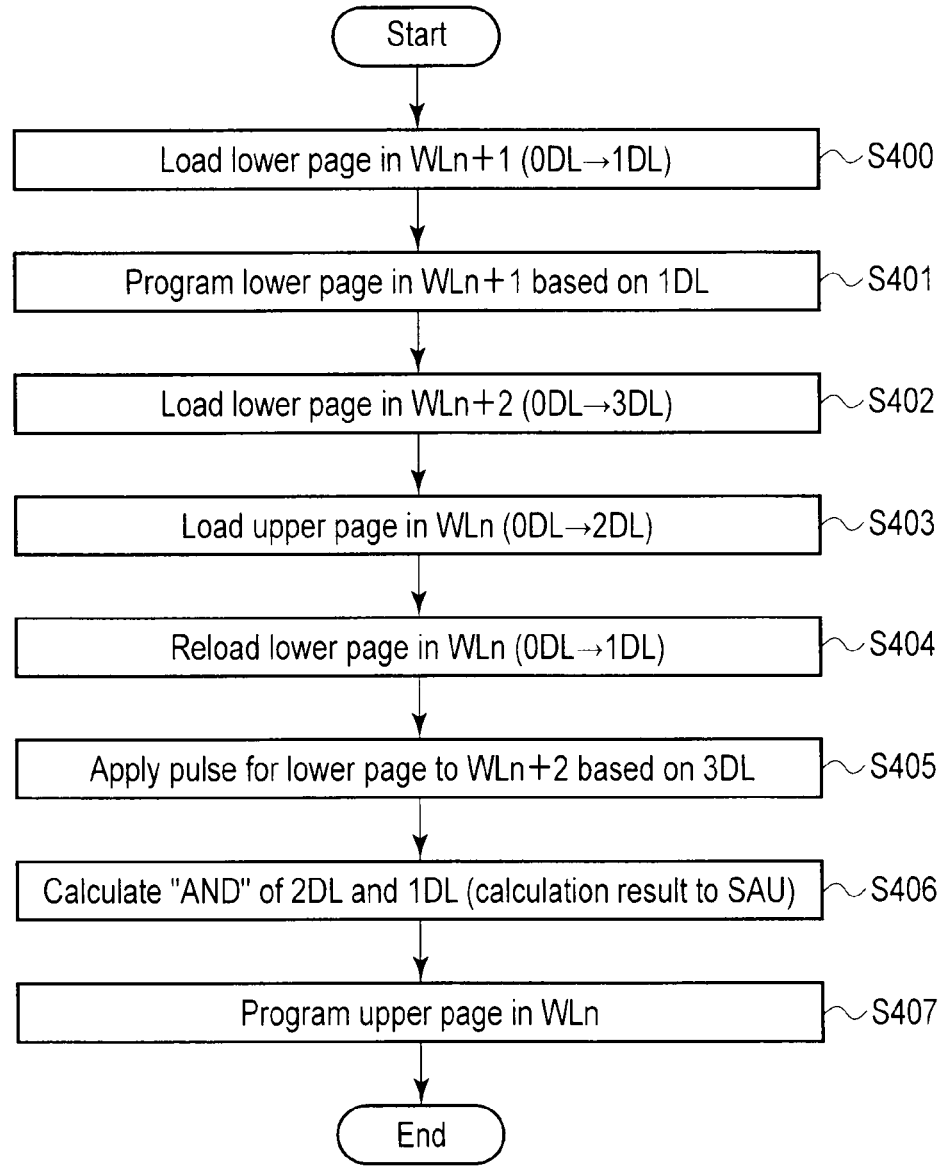
FIG. 21 is a flowchart illustrating a program sequence according to a modification.
Figure 22:
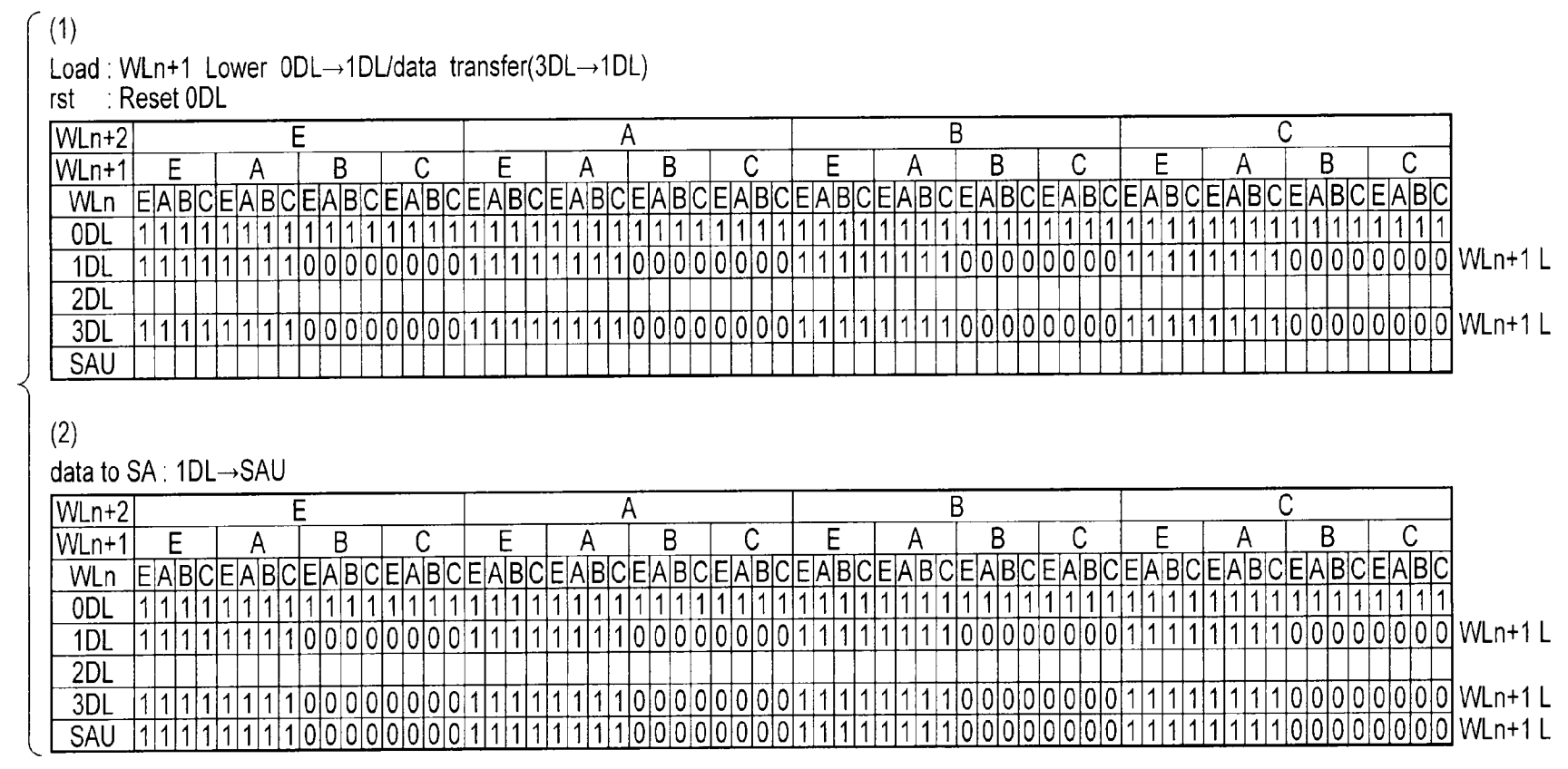
Figure 23:
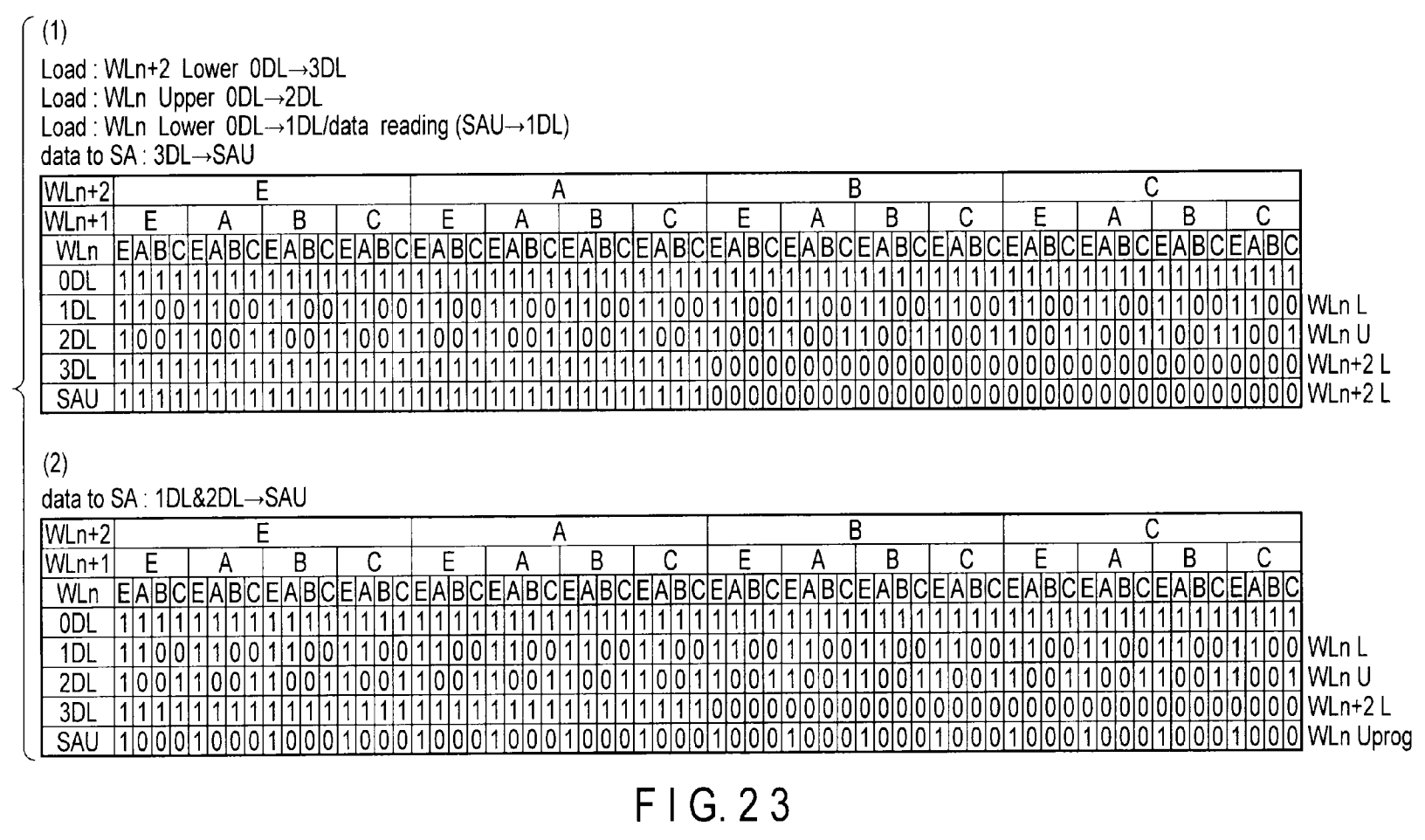

FIG. 21 is a flowchart illustrating a program sequence according to the first modification of the third embodiment. FIGS. 22 and 23 are views illustrating the correspondence between word line levels ("E" level, "A" level, "B" level and "C" level) and latch data of the data latch circuit DL and the sense amplifier unit SAU.

Step S400 is the same as step S300 of FIG. 19. If necessary, the data latch circuit 0DL is reset so that it can be used for other operations. The latch data in step S400 are as shown in FIG. 22(1).

Subsequently, the lower page data in the word line WLn+1 are transferred from the data latch circuit 1DL to the sense amplifier unit SAU, and the lower page in the word line WLn+1 is programmed (step S401). The latch data in step S401 are as shown in FIG. 22(2).

Subsequently, the lower page data in the word line WLn+2 are transferred to the data latch circuit 3DL (step S402), and the upper page data in the word line WLn are transferred to the data latch circuit 2DL (step S403), and the lower page data in the word line WLn are transferred to the data latch circuit 1DL (step S404). These steps are the same as steps S301, S304, and S305 of FIG. 19.

Subsequently, the lower page data in the word line WLn+2 are transferred from the data latch circuit 3DL to the sense amplifier unit SAU, and one pulse of program voltage for lower page is applied to the word line WLn+2 (step S405). The latch data in step S405 are as shown in FIG. 23(1).

Subsequently, like steps S306 and S307 of FIG. 19, the upper page in the word line WLn is programmed (step S406 and S407). Therefore, immediately before the upper page in the word line WLn is programmed, one pulse of program voltage can be applied to the word line WLn+2.

[3-3] Second Modification

Figure 25:
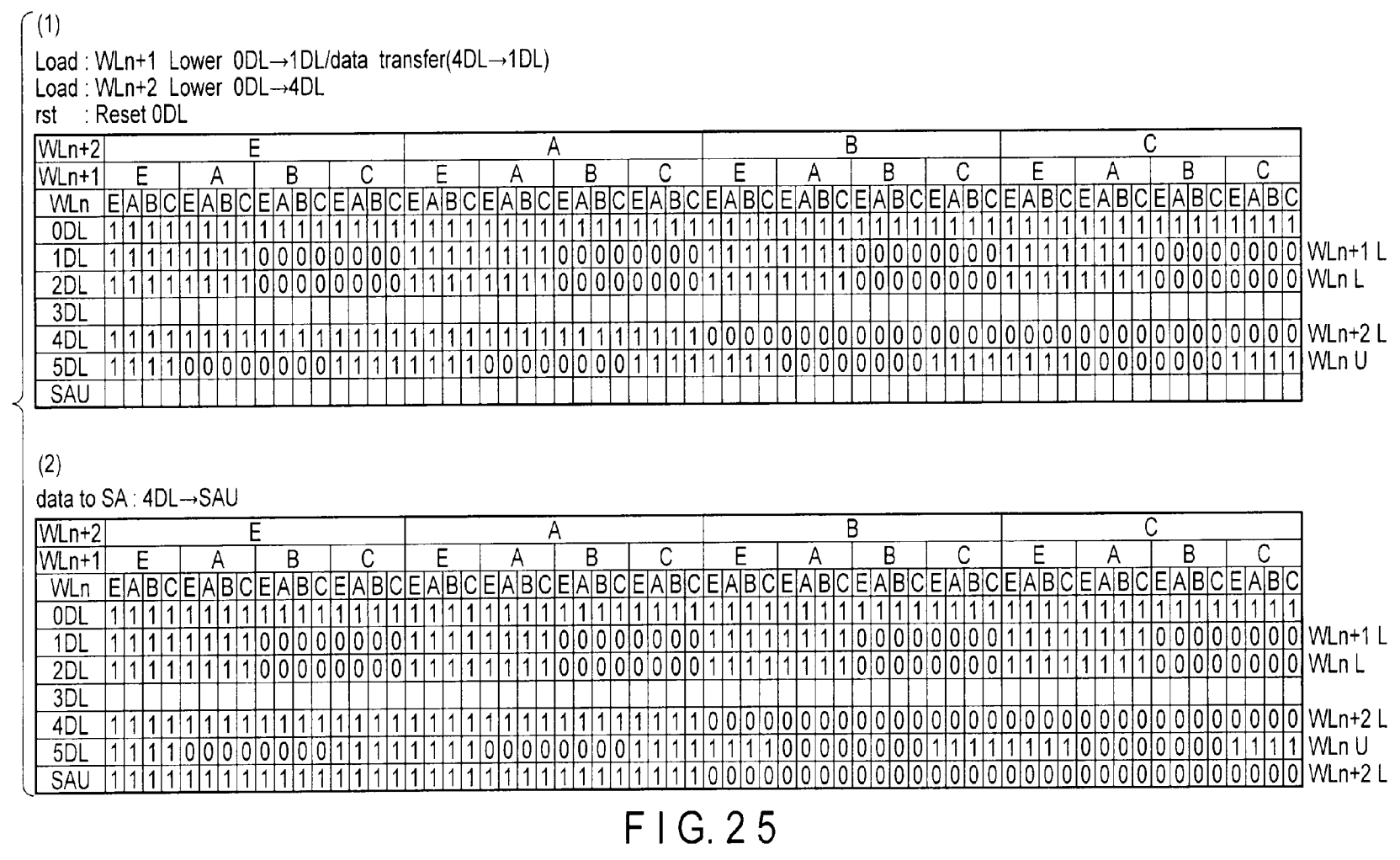
Figure 26:
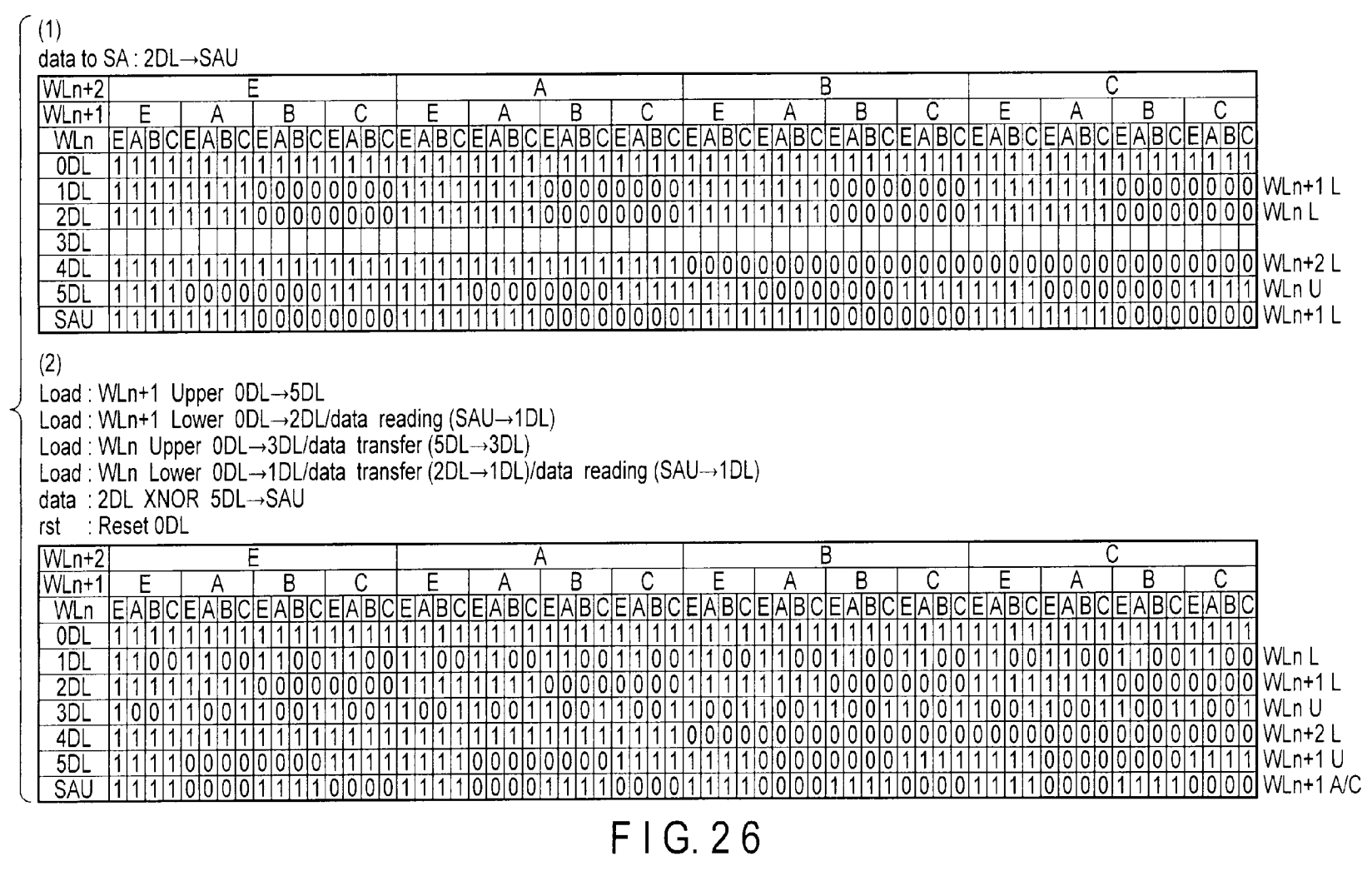
Figure 27:
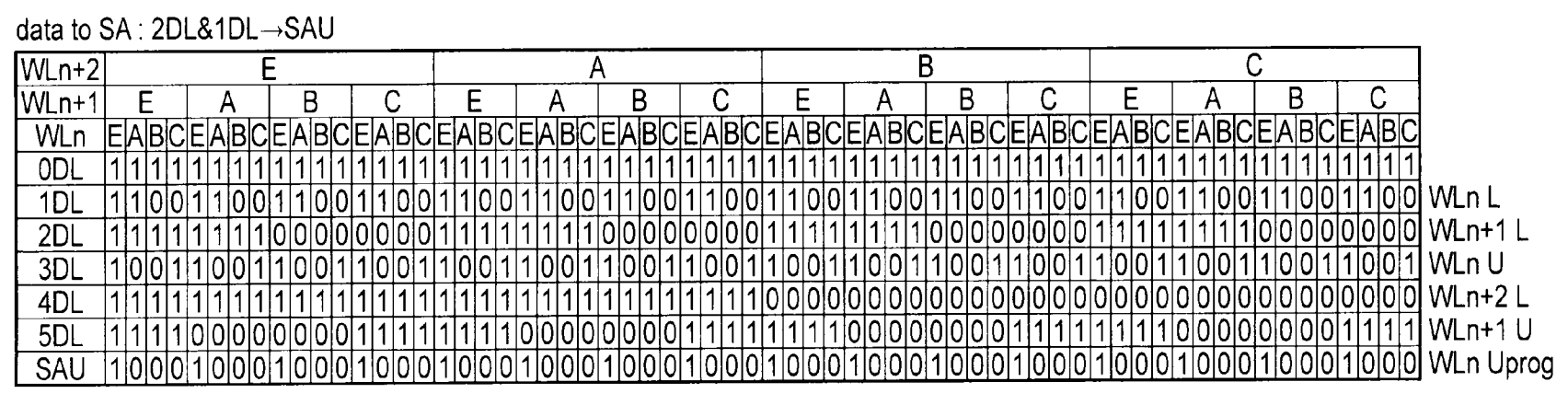

When the upper page in the word line WLn is programmed, the program method according to the second embodiment may also be used. FIG. 24 is a flowchart illustrating a program sequence according to the second modification of the third embodiment. FIG. 25 to FIG. 27 are views illustrating the correspondence between word line levels ("E" level, "A" level, "B" level, and "C" level) and latch data of the data latch circuit DL and the sense amplifier unit SAU.

Steps S500 and 501 are the same as steps S300 and S301 of FIG. 19. However, the lower page in the word line WLn+2 is latched in the data latch circuit 4DL. The latch data in step S501 are as shown in FIG. 25(1). At this occasion, the lower page data in the word line WLn used for programming in a previous stage still remain in the data latch circuit 2DL, and the upper page data in the word line WLn used for programming in the previous stage still remain in the data latch circuit 5DL.

Subsequently, the lower page data in the word line WLn+2 are transferred from the data latch circuit 4DL to the sense amplifier unit SAU, and one pulse of program voltage for lower page is applied to the word line WLn+2 (step S502). The latch data in step S502 are as shown in FIG. 25(2).

Subsequently, the lower page data in the word line WLn+1 are transferred from the data latch circuit 1DL to the sense amplifier unit SAU, and the lower page in the word line WLn+1 is programmed (step S503). The latch data in step S503 are as shown in FIG. 26(1). At this moment, the following steps have been achieved. When the lower page in the word line WLn+1 is programmed, one pulse of program voltage for lower page is applied to the word line WLn+2, and then the lower page in the word line WLn+1 is programmed.

Subsequently, the upper page data to be programmed in the word line WLn+1 are loaded, and are transferred to the data latch circuit 5DL via the data latch circuit 0DL (step S504). Subsequently, the lower page data to be programmed in the word line WLn+1 are loaded again, and are transferred to the data latch circuit 2DL via the data latch circuit 0DL (step S505). In step S505, the lower page data in the word line WLn+1 have already been programmed. Accordingly, the data in the word line WLn+1 may be read to the sense amplifier unit SAU, and the data may be transferred to the data latch circuit 2DL.

Subsequently, like steps S304 and S305, the upper page data and the lower page data in the word line WLn are loaded (step S506 and S507). However, the upper page data in the word line WLn are latched in the data latch circuit 3DL.

Subsequently, like step S206, XNOR of 2DL and 5DL is calculated, and the calculation result is transferred to the sense amplifier unit SAU (step S508). If necessary, the data latch circuit 0DL is reset so that it can be used for other operations. The latch data in step S508 are as shown in FIG. 26(2). Subsequently, like step S207, using data of the sense amplifier unit SAU, one pulse of program voltage is applied to the memory cells to be set to "A" level and "C" level in the word line WLn+1 (step S509).

Steps S510 and S511 subsequent thereto are the same as those of the second embodiment. Therefore, it is possible to reduce the inter-cell interference effect that the word line WLn receives from the word line WLn+1 and reduce a portion of the inter-cell interference effect that the word line WLn receives from the word line WLn+2.

[3-4] Effects

As hereinabove explained in detail, in the third embodiment, one pulse of writing voltage is applied to the adjacent word line WLn+2 which is adjacent to the drain of the selected word line WLn before the upper page in the selected word line WLn is programmed. In this state, the threshold voltage in the adjacent word line WLn+2 is set at a value somewhat close to the threshold voltage at which the lower page is finally programmed. Further, before the upper page in the selected word line WLn is programmed, programming of the adjacent word line WLn+1 adjacent to the drain of the selected word line WLn is completed. Thereafter, the upper page in the selected word line WLn is programmed.

Therefore, according to the third embodiment, the upper page in the selected word line WLn can be programmed while the inter-cell interference effect is received from the adjacent word line WLn+2 adjacent to the adjacent word line. Therefore, when the program is finally completed, it is possible to reduce the inter-cell interference effect that the selected word line WLn receives from the adjacent word line WLn+2 adjacent to the adjacent word line. The effects other than the above are the same as those of the first embodiment.

[4] Fourth Embodiment

The program order of the multi-level program is not limited to what is shown in FIG. 13. In the fourth embodiment, program is made in the ascending order such as follows: the lower page in WLn, the upper page in WLn, the lower page in WLn+1, and then the upper page in WLn+1.

Figure 28:
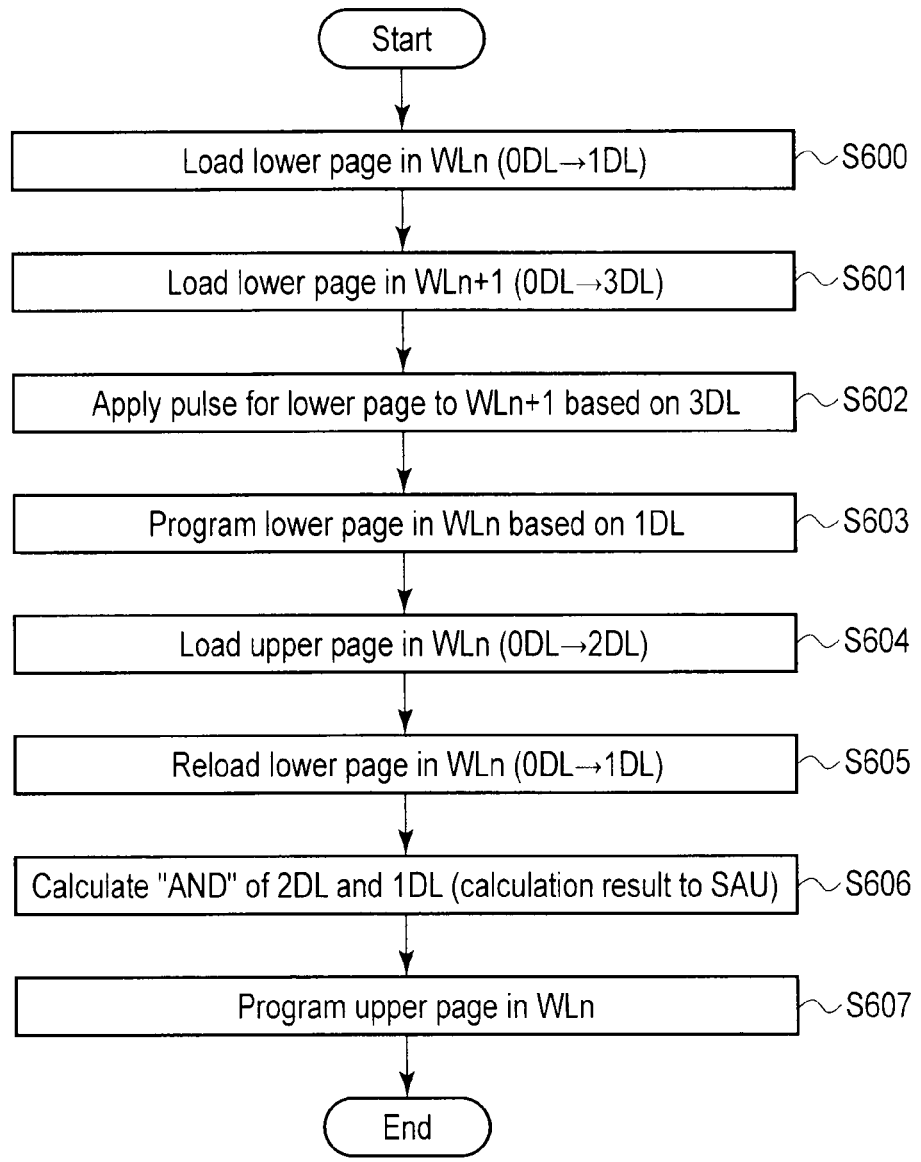
FIG. 28 is a flowchart illustrating a program sequence according to the fourth embodiment.

FIG. 28 is a flowchart illustrating a program sequence according to the fourth embodiment. FIG. 29 is a view illustrating the correspondence between word line levels ("E" level, "A" level, "B" level and "C" level) and latch data of the data latch circuit DL and the sense amplifier unit SAU.

First, lower page data to be programmed in the word line WLn are loaded from the outside via the input/output control circuit 15, and are once latched in the data latch circuit 0DL. Then, data in the data latch circuit 0DL are transferred to the data latch circuit 1DL (step S600). Alternatively, program data of a previous stage still remain in the data latch circuit 3DL, and accordingly the data in the data latch circuit 3DL may be transferred to the data latch circuit 1DL.

Subsequently, lower page data to be programmed in the word line WLn+1 are loaded from the outside via the input/output control circuit 15, and are once latched in the data latch circuit 0DL. Then, data in the data latch circuit 0DL are transferred to the data latch circuit 3DL (step S601). If necessary, the data latch circuit 0DL is reset so that it can be used for other operations. The latch data in step S601 are as shown in FIG. 29(1).

Subsequently, the lower page data in the word line WLn+1 are transferred from the data latch circuit 3DL to the sense amplifier unit SAU, and one pulse of program voltage for lower page is applied to the word line WLn+1 (step S602). The latch data in step S602 are as shown in FIG. 29(2).

Subsequently, the lower page data in the word line WLn are transferred from the data latch circuit 1DL to the sense amplifier unit SAU, and the lower page in the word line WLn is programmed (including verification) (step S603). The latch data in step S603 are as shown in FIG. 29(3). At this moment, the following steps have been achieved. When the lower page in the word line WLn is programmed, one pulse of program voltage for lower page is applied to the word line WLn+1, and then the lower page in the word line WLn is programmed.

Subsequently, the upper page data to be programmed in the word line WLn are loaded, and are transferred to the data latch circuit 2DL via the data latch circuit 0DL (step S604). Subsequently, the lower page data to be programmed in the word line WLn are loaded again, and are transferred to the data latch circuit 1DL via the data latch circuit 0DL (step S605). In step S605, the lower page data in the word line WLn have already been programmed. Accordingly, the data in the word line WLn may be read to the sense amplifier unit SAU, and the data may be transferred to the data latch circuit 1DL.

At this moment, data for programming the upper page in the word line WLn have been prepared. Subsequently, the upper page data in the word line WLn are generated by calculating AND of 2DL and 1DL, and this calculation result is transferred to the sense amplifier unit SAU (step S606). Subsequently, the upper page in the word line WLn is programmed (including verification) (step S607). Therefore, it is possible to reduce a portion of the inter-cell interference effect that the word line WLn receives from the word line WLn+1.

(Effects)

As hereinabove explained in detail, in the fourth embodiment, in the method for programming the word lines in the ascending order, one pulse of writing voltage is applied to the adjacent word line WLn+1 which is adjacent to the drain of the selected word line WLn immediately before the selected word line WLn is programmed. In this state, the threshold voltage in the adjacent word line WLn+1 is set at a value somewhat close to the threshold voltage at which the lower page is finally programmed. Thereafter, the selected word line WLn is programmed.

Therefore, according to the fourth embodiment, the selected word line WLn can be programmed while the inter-cell interference effect is received from the adjacent word line WLn+1. Therefore, when the program is finally completed, it is possible to reduce the inter-cell interference effect that the selected word line WLn receives from the adjacent word line WLn+1. The effects other than the above are the same as those of the first embodiment.

It should be noted that the third embodiment can be applied to the fourth embodiment.

[5] Fifth Embodiment

For example, in the above second embodiment, one pulse of program voltage is applied to the adjacent word line WLn+1 in the program sequence of the selected word line WLn. However, the embodiment is not Limited thereto. The program voltage may be applied to WLn+1 for two or more times, i.e., two or more pulses of program voltage may be applied.

Figure 30:
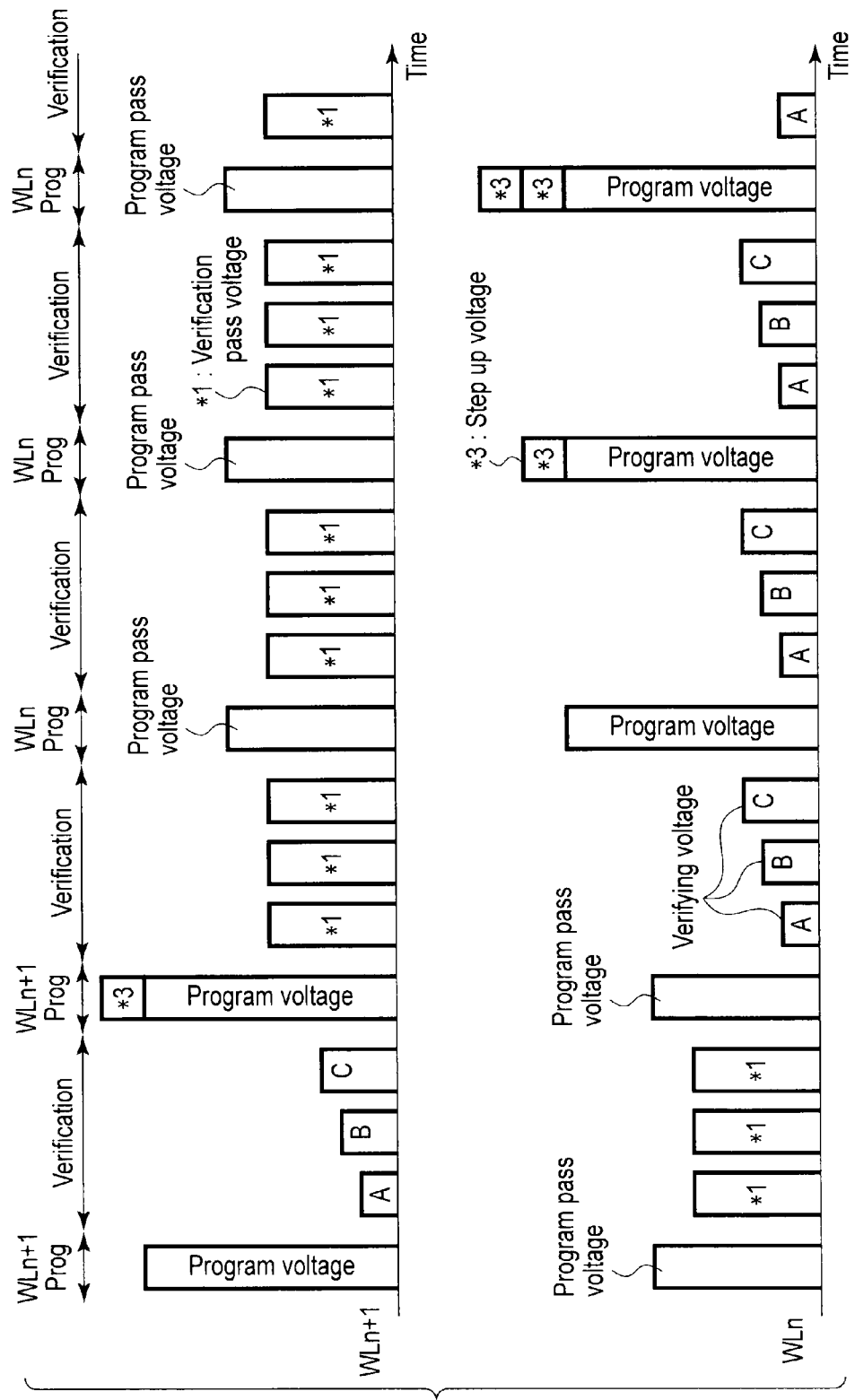
FIG. 30 is a view illustrating a voltage relationship during programming according to the fifth embodiment.

FIG. 30 is a view illustrating the voltage relationship applied to a word line during programming according to the fifth embodiment. FIG. 30 shows the selected word line WLn and the adjacent word line WLn+1 adjacent to the drain of the word line WLn.

As shown in FIG. 30, in the program sequence of WLn, one pulse of program voltage is applied to the word line WLn+1 immediately before the word line WLn is programmed. At this occasion, two pulses of program voltage are applied to the word line WLn+1. The second pulse is higher than the first pulse by the step up voltage. After one pulse of program voltage is applied to the word line WLn+1, verification is performed.

Therefore, the word line WLn can be programmed after the word line WLn+1 is set at a higher threshold voltage, and this further reduces the inter-cell interference effect that the word line WLn receives from the word line WLn+1.

In FIG. 30, the word line WLn is verified before the program voltage is applied to the word line WLn in the program of the word line WLn. Therefore, the program voltage is not applied to the memory cell that has been successfully verified first, and this prevents excessive writing to the word line WLn.

In FIG. 30, two pulses of program voltage are applied. Alternatively, it should be understood that two or more pulses may also be applied. Further, the fifth embodiment can be applied to the above first to fourth embodiments.

After the verification, data become different from what are loaded. Therefore, it is necessary to prepare again data loaded to apply a pulse in a previous stage, when the same are necessary for programming, by reading the data if they are programmed data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   memory cells storing data in a nonvolatile manner;
   word lines connected to the memory cells and including a first word line and a second word line which is n-th (n is an integer of 1 or more) from the first word line; and
   a control circuit configured to control a voltage of a word line to write data to a memory cell so that data are written in order from the first word line to the second word line,
   wherein in a write sequence of the first word line, the control circuit applies a writing voltage to the second word line before writing a memory cell connected to the first word line.

2. The device of claim 1, wherein the write sequence of the first word line includes an operation for applying a step-up writing voltage to the first word line and a write verification operation.

3. The device of claim 1, wherein the control circuit performs a write verification operation to the first word line before the writing voltage is applied to the first word line.

4. The device of claim 3, wherein the control circuit applies a writing voltage to a memory cell in which the write verification operation is not passed.

5. The device of claim 1, wherein the control circuit applies the writing voltage to the second word line twice.

6. The device of claim 1 further comprising:
   a first latch circuit configured to latch write data for the first word line; and
   a second latch circuit configured to latch write data for the second word line,
   wherein the control circuit uses data of the first and second latch circuits to perform the write sequence to the first word line.

7. A nonvolatile semiconductor memory device comprising:
   memory cells capable of storing m-bit (m is an integer of 2 or more) data in a nonvolatile manner, the m-bit data including low bit data and high bit data;
   word lines connected to the memory cells and including a first word line and a second word line which is n-th (n is an integer of 1 or more) from the first word line; and
   a control circuit configured to control a voltage of a word line to write low bit data and high bit data to a memory cell so that data are written in order from the first word line to the second word line,
   wherein in a write sequence of the first word line, the control circuit applies a writing voltage to the second word line before writing a memory cell connected to the first word line.

8. The device of claim 7, wherein the control circuit applies the writing voltage to a memory cell whose a threshold voltage greatly changes when changing from a low bit write state to a high bit write state among memory cell connected to the second word line.

9. The device of claim 8, wherein when each of the memory cells stores 2-bit data, the memory cell is set to any one of a first threshold level, a second threshold level, a third threshold level, and a fourth threshold level in ascending order of the threshold voltage, and
   the control circuit applies a writing voltage to a memory cell at the second threshold level and the fourth threshold level among the memory cells connected to the second word line.

10. The device of claim 7, wherein the write sequence of the first word line includes a writing operation of the high bit data.

11. The device of claim 7, wherein the write sequence of the first word line includes an operation for applying a step-up writing voltage to the first word line and a write verification operation.

12. The device of claim 7, wherein the control circuit performs a write verification operation to the first word line before the writing voltage is applied to the first word line.

13. The device of claim 12, wherein the control circuit applies a writing voltage to a memory cell in which the write verification operation is not passed.

14. The device of claim 7, wherein the control circuit applies the writing voltage to the second word line twice.

15. The device of claim 7, further comprising:
   a first latch circuit configured to latch write data for the first word line; and
   a second latch circuit configured to latch write data for the second word line,
   wherein the control circuit uses data of the first and second latch circuits to perform the write sequence to the first word line.

16. A nonvolatile semiconductor memory device comprising:
   memory cells storing data in a nonvolatile manner;

word lines connected to the memory cells and including a first word line, a second word line adjacent to the first word line, and a third word line adjacent to the second word line; and a control circuit configured to control a voltage of a word line to write data to a memory cell so that data are written in order from the first word line to the third word line, wherein in a write sequence of the first word line, the control circuit applies a writing voltage to the third word line and applies a writing voltage to the second word line before writing a memory cell connected to the first word line.

17. The device of claim 16, wherein the write sequence of the first word line includes an operation for applying a step-up writing voltage to the first word line and a write verification operation.

18. The device of claim 16, wherein the control circuit performs a write verification operation to the first word line before the writing voltage is applied to the first word line.

19. The device of claim 16, wherein the control circuit applies the writing voltage to the second word line twice.

20. The device of claim 16, further comprising:
a first latch circuit configured to latch write data for the first word line;
a second latch circuit configured to latch write data for the second word line; and
a third latch circuit configured to latch write data for the third word line,
wherein the control circuit uses data of the first to third latch circuits to perform the write sequence to the first word line.

* * * * *